United States Patent
Iwata et al.

(10) Patent No.: US 7,177,188 B2
(45) Date of Patent: *Feb. 13, 2007

(54) SEMICONDUCTOR MEMORY DEVICE, DISPLAY DEVICE, AND PORTABLE ELECTRONIC APPARATUS

(75) Inventors: Hiroshi Iwata, Nara (JP); Akihide Shibata, Nara (JP); Yoshifumi Yaoi, Yamatokoriyama (JP); Yasuaki Iwase, Tenri (JP); Masaru Nawaki, Nara (JP); Yoshinao Morikawa, Ikoma (JP); Kenichi Tanaka, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 25 days.

This patent is subject to a terminal disclaimer.

(21) Appl. No.: 10/775,254

(22) Filed: Feb. 11, 2004

(65) Prior Publication Data

US 2004/0160828 A1 Aug. 19, 2004

(30) Foreign Application Priority Data

Feb. 12, 2003 (JP) .............................. 2003-034307

(51) Int. Cl.
*G11C 16/00* (2006.01)

(52) U.S. Cl. ..................... 365/185.05; 365/185.17; 365/185.21

(58) Field of Classification Search ............ 365/185.05
See application file for complete search history.

(56) References Cited

U.S. PATENT DOCUMENTS

| | | | | |
|---|---|---|---|---|
| 4,355,375 A * | 10/1982 | Arakawa | ................ | 365/185.01 |
| 4,964,080 A * | 10/1990 | Tzeng | ................... | 365/185.01 |
| 5,021,999 A * | 6/1991 | Kohda et al. | .......... | 365/185.03 |
| 5,293,328 A * | 3/1994 | Amin et al. | ........... | 365/185.14 |
| 5,408,115 A * | 4/1995 | Chang | ........................ | 257/324 |
| 5,424,979 A * | 6/1995 | Morii | ..................... | 365/185.28 |
| 5,440,158 A * | 8/1995 | Sung-Mu | ..................... | 257/314 |
| 5,457,061 A * | 10/1995 | Hong et al. | ................. | 438/261 |
| 5,760,435 A * | 6/1998 | Pan | ............................. | 257/314 |
| 5,812,449 A * | 9/1998 | Song | ..................... | 365/185.03 |
| 5,838,041 A * | 11/1998 | Sakagami et al. | .......... | 257/324 |
| 6,359,807 B1 * | 3/2002 | Ogura et al. | ........... | 365/185.18 |
| 6,384,448 B1 | 5/2002 | Forbes | | |
| 6,714,454 B2 * | 3/2004 | Ma et al. | ................ | 365/185.18 |
| 6,838,726 B1 * | 1/2005 | Forbes et al. | ................ | 257/321 |
| 6,894,929 B2 * | 5/2005 | Matsuoka et al. | ...... | 365/185.14 |
| 2004/0164359 A1 | 8/2004 | Iwata et al. | | |

FOREIGN PATENT DOCUMENTS

| | | |
|---|---|---|
| JP | 5-81072 B2 | 11/1993 |
| JP | 5-304277 A | 11/1993 |

(Continued)

*Primary Examiner*—Tan T. Nguyen
(74) *Attorney, Agent, or Firm*—Birch, Stewart, Kolasch & Birch, LLP

(57) ABSTRACT

A semiconductor memory device includes: a memory cell having a gate electrode formed on a semiconductor layer via a gate insulating film, a channel region disposed below the gate electrode, a diffusion region disposed on both sides of the channel region and having a conductive type opposite to that of the channel region, and memory functional units formed on both sides of the gate electrode and having a function of retaining charges; and an amplifier, the memory cell and the amplifier being connected to each other so that an output of the memory cell is inputted to the amplifier.

13 Claims, 18 Drawing Sheets

FOREIGN PATENT DOCUMENTS

| | | |
|---|---|---|
| JP | 9-116119 A | 5/1997 |
| JP | 2000-195974 | 7/2000 |
| JP | 2001-156188 A | 6/2001 |
| JP | 2001-230332 A | 8/2001 |
| JP | 2001-512290 A | 8/2001 |
| KR | 90-001226 | 3/1990 |
| WO | WO01/17030 A | 3/2001 |
| WO | WO03/044868 A | 5/2003 |
| WO | WO03/075358 A | 9/2003 |
| WO | WO03/075359 A | 9/2003 |
| WO | WO03/103058 A | 12/2003 |
| WO | WO2004/034474 A | 4/2004 |

* cited by examiner

SEMICONDUCTOR MEMORY DEVICE, DISPLAY DEVICE, AND PORTABLE ELECTRONIC APPARATUS

CROSS-REFERENCE TO RELATED APPLICATION

This application is related to Japanese application No. 2003-34307 filed on Feb. 12, 2003, whose priority is claimed under 35 USC §119, the disclosure of which is incorporated by reference in its entirety.

BACKGROUND OF THE INVENTION

1. Field of the Invention

The present invention relates to a semiconductor memory device, a display device, and a portable electronic apparatus. More specifically, the present invention relates to a semiconductor memory device in which field effect transistors each including a memory functional unit having the function of retaining a charge or polarization are arranged, and to a display device and a portable electronic apparatus each having such a semiconductor memory device.

2. Description of the Related Art

Conventionally, a flash memory is typically used as a nonvolatile memory.

In a flash memory, as shown in FIG. 28, a floating gate 902, an insulating film 907 and a word line (control gate) 903 are formed in this order on a semiconductor substrate 901 via a gate insulating film. On both sides of the floating gate 902, a source line 904 and a bit line 905 are formed by a diffusion region, thereby constructing a memory cell. A device isolation region 906 is formed around the memory cell (see, for example, Japanese Unexamined Patent Publication No. HEI 5(1993)-304277).

The memory cell retains data according to the more or less a charge amount in the floating gate 902. In a memory cell array constructed by arranging the memory cells, an operation of rewriting/reading a desired memory cell can be performed, by selecting a specific word line and a specific bit line and applying a predetermined voltage.

In such a flash memory, when a charge amount in the floating gate changes, a drain current (Id)-gate voltage (Vg) characteristic as shown in FIG. 29 is displayed. When the amount of negative charges in the floating gate increases, the threshold increases, and an Id-Vg curve shifts almost in parallel in the direction of increasing Vg.

In such a flash memory, however, it is necessary to dispose the insulating film 907 for separating the floating gate 902 from the word line 903 from the functional viewpoint. In addition, it is difficult to reduce the thickness of the gate insulating film in order to prevent leakage of charges from the floating gate 902. It is therefore difficult to effectively reduce the thickness of the insulating film 907 and the gate insulating film, and it disturbs reduction in size of the memory cell.

SUMMARY OF THE INVENTION

Various embodiments of the present invention provide a finer semiconductor memory device and a finer portable electronic apparatus.

Disclosed herein is a semiconductor memory device including: a memory cell having a gate electrode formed on a semiconductor layer via a gate insulating film, a channel region disposed below the gate electrode, a diffusion region disposed on both sides of the channel region and having a conductive type opposite to that of the channel region, and memory functional units formed on both sides of the gate electrode and having a function of retaining charges; and an amplifier, the memory cell and the amplifier being connected to each other so that an output of the memory cell is inputted to the amplifier.

With such a configuration, since an output of the memory cell is inputted to the amplifier, information stored in the memory cell can be read. In the memory cell, a memory function of the memory functional unit and a transistor operation function of the gate insulating film are separated from each other. Consequently, it is easy to suppress the short channel effect by reducing the size of the gate insulating film while remaining the sufficient memory function. Further, a value of current flowing between the diffusion regions by rewriting changes larger as compared with the case of an EEPROM. Therefore, it facilitates discrimination between the writing state and the erasing state of the semiconductor memory device.

With such a configuration, the memory cell can be formed by a process which is very compatible with a normal transistor forming process. Therefore, as compared with the case of by using a conventional flash memory as a nonvolatile memory cell and forming the memory cell together with an amplifier which is usually made by a transistor, the number of masks and the number of processes can be dramatically reduced. Consequently, the yield of a chip on which the memory cell and the amplifier are formed together can be improved. Because of this, the manufacturing cost is reduced, and a very-reliable, cheap semiconductor memory device can be obtained.

From another aspect, the present invention also provides a semiconductor memory device including: a memory cell having a gate electrode formed on a semiconductor layer via a gate insulating film, a channel region disposed below the gate electrode, a diffusion region disposed on both sides of the channel region and having a conductive type opposite to that of the channel region, and memory functional units formed on both sides of the gate electrode and having a function of retaining charges; and an amplifier, the memory cells being paired, and outputs of the paired memory cells being inputted to the same amplifier.

With such a configuration, effects similar to those of the above-described semiconductor memory device can be obtained. Further, since outputs of the paired memory cells are inputted to the same amplifier, the difference between currents flowing in the two memory cells having similar device structures can be detected. Therefore, reliability of the reading operation is improved.

Furthermore, an embodiment of the present invention also provides a display device and a portable electronic apparatus in which the above semiconductor memory device is incorporated.

With such a configuration, for example, in the case of using the semiconductor memory device for storing information for correcting display variations after manufacturing of a display panel, uniform picture quality can be obtained in products of display devices. Moreover, a process for forming the memory cell and a logic circuit simultaneously is simple, the manufacturing cost can be suppressed. The operation speed can be improved by high-speed reading operation, a cheap and high-performance display device and a cheap and high-performance portable electronic apparatus can be obtained.

These and other aspects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE INVENTION

Figure 1:
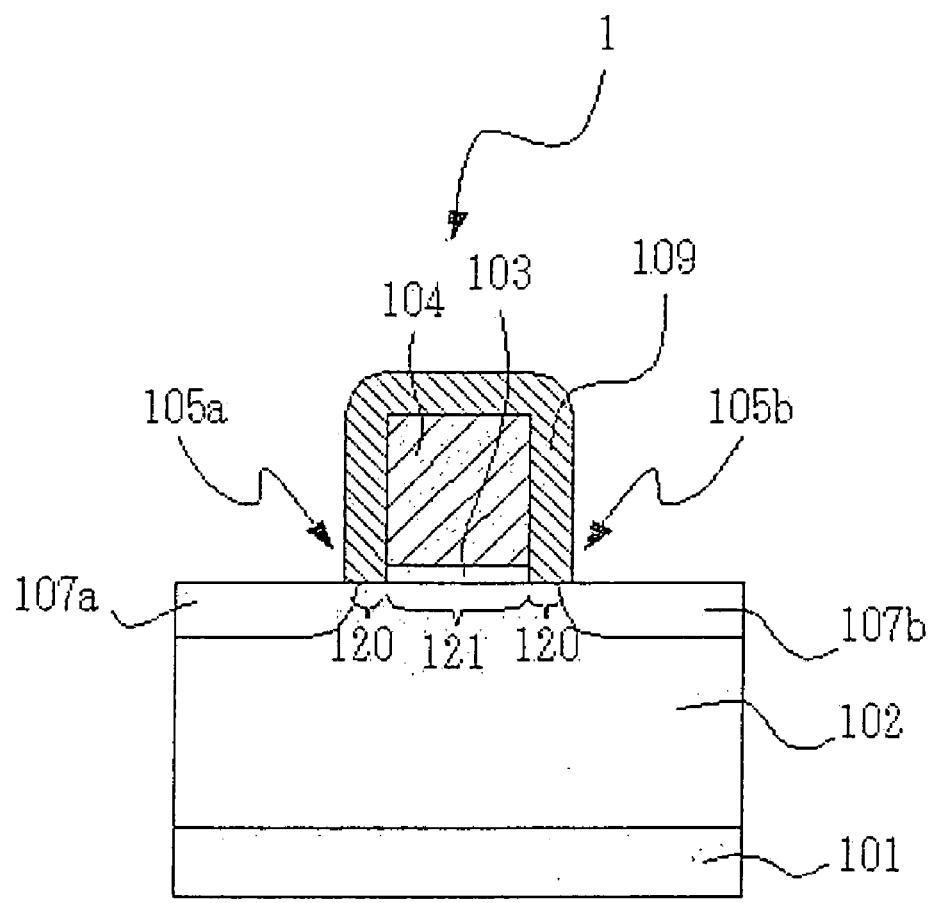
FIG. 1 is a schematic sectional view of a principal portion of a memory cell constituted a semiconductor memory device of the present invention (first embodiment)

A semiconductor memory device of an embodiment of the present invention is mainly constructed by a memory cell and an amplifier.

The memory cell is mainly constructed by a semiconductor layer, a gate insulating film, a gate electrode, a channel region, a diffusion region and a memory functional unit. Herein, the channel region is normally a region of the same conductive type as that of the semiconductor layer and denotes a region below the gate electrode. The diffusion region denotes a region of the conductive type opposite to that of the channel region.

Concretely, the memory cell may be constructed by a region of a first conductive type as the diffusion region, a region of a second conductive type as the channel region, the memory functional unit disposed across a border of the regions of the first and second conductive types, and an electrode provided via the gate insulating film or a insulating film. It is suitable that the memory cell is constructed by the gate electrode formed on the gate insulating film, two memory functional units formed on both sides of the gate electrode, two diffusion regions disposed on the opposite sides of the gate electrode of the memory functional units, and a channel region disposed below the gate electrode.

In the disclosed semiconductor device the semiconductor layer is formed on the semiconductor substrate as the semiconductor layer, preferably, on a well region of the first conductive type formed in the semiconductor substrate.

The semiconductor substrate is not particularly limited as long as it can be used for a semiconductor device, and an example thereof includes a bulk substrate made of an element semiconductor such as silicon, germanium or the like or a compound semiconductor such as silicon germanium, GaAs, InGaAs, ZnSe or GaN. As a substrate having a semiconductor layer on its surface, various substrates such as an SOI (Silicon on Insulator) substrate, an SOS (Silicon on Sapphire) substrate and a multilayer SOI substrate, or a glass or plastic substrate having thereon a semiconductor layer may be used. In particular, a silicon substrate and an SOI substrate having a semiconductor layer on its surface are preferable. The semiconductor substrate or semiconductor layer may be single crystal (formed by, for example, epitaxial growth), polycrystal, or amorphous although the more or less of an amount of current flowing therein varies.

On the semiconductor layer, preferably, a device isolation region is formed. Further, a single layer or multilayer structure may be formed by a combination of devices such as a transistor, a capacitor and a resistor, a circuit formed by the devices, a semiconductor device, and an interlayer insulating film. The device isolation region can be formed by any of various device isolation films such as an LOCOS film, a trench oxide film and an STI film. The semiconductor layer may be of the P or N conductive type. In the semiconductor layer, preferably, at least one well region of the first conductive type (P or N type) is formed. Impurity concentration which is within a known range in this field can be used as impurity concentration in the semiconductor layer and the well region. In the case of using the SOI substrate as the semiconductor layer, the well region may be formed in the surface semiconductor layer and a body region may be provided below the channel region.

The gate insulating film or the insulating film is not particularly limited as long as it is usually used for a semiconductor device, and examples thereof include a single-layer film or a laminated film of an insulating film such as a silicon oxide film or a silicon nitride film, or a high dielectric constant film such as an aluminum oxide film, a titanium oxide film, a tantalum oxide film or a hafnium oxide film. Particularly, a silicon oxide film is preferable. The gate insulating film has a thickness of, for example, about 1 to 20 nm, preferably, about 1 to 6 nm. The gate insulating film may be formed only immediately below the gate electrode or formed so as to be larger (wider) than the gate electrode.

The gate electrode or the electrode is formed in a shape which is usually used for a semiconductor device or a shape having a recess in a lower end portion on the gate insulating film. The gate electrode is preferably formed in an integral form. The gate electrode formed in the integral form means that the gate electrode comprised a single-layered or multilayer conductive film is not separated and formed in an integral form. The gate electrode may have a side-wall insulating film on its sidewalls. Usually, the gate electrode is not particularly limited as long as it is used for a semiconductor device, and examples of thereof includes a conductive film, for example, a single-layered or multilayer film made of polysilicon, a metal such as copper or aluminum, a high-refractory metal such as tungsten, titanium or tantalum, and a silicide with the high refractory metal. Suitable thickness of the gate electrode is, for example, about 50 to 400 nm. Below the gate electrode, a channel region is formed.

In other words, the memory functional unit contains a film (hereinafter, described as "charge retaining function film") or a region had the function of retaining charges, the function of accumulating and retaining charges, the function of trapping charges or the function of holding a charge polarization state. Examples of elements having the above function include: silicon nitride; silicon; a silicate glass including impurity such as phosphorus or boron; silicon carbide; alumina; a high dielectric material such as hafnium oxide, zirconium oxide or tantalum oxide; zinc oxide; ferroelectric; metals, and the like. Therefore, the memory functional unit can be formed by, for example, a single-layered or laminated structure of: an insulating film including a silicon nitride film; an insulating film having therein a conductive film or a semiconductor layer; an insulating film including at least one conductor or semiconductor dot; or an insulating film including a ferroelectric film of which inner charge is polarized by an electric field and in which the polarized state is held. Particularly, the silicon nitride film is preferable for the reason that the silicon nitride film can obtain a large hysteretic characteristic since a number of levels of trapping charges exist. In addition, the charge retention time is long and a problem of charge leakage due to occurrence of a leak path does not occur, so that the retention characteristics are good. Further, silicon nitride is a material which is used as standard in an LSI process.

Reliability of storage and retention can be increased by using the insulating film including a film having the charge retaining function such as a silicon nitride film as the memory functional unit. Since the silicon nitride film is an insulator, even in the case where a charge leak occurs in part of the silicon nitride film, the charges in the whole silicon nitride film are not lost immediately. In the case of arranging a plurality of memory cells, even when the distance between the memory cells is shortened and neighboring memory functional units come into contact with each other, unlike the case where the memory functional units are made of conductors, information stored in the memory functional units is not lost. Further, a contact plug can be disposed closer to the memory functional unit. In some cases, the contact plug can be disposed so as to be overlapped with the memory functional unit. Thus, reduction in size of the memory cell is facilitated.

The film having the charge retaining function does not always have to have a film shape in order to increase the reliability of storage and retention. Preferably, films having the charge retaining function exist discretely in an insulating film. Concretely, it is preferable that the materials having the charge retaining function in the shape of dots be spread in a material which is hard to retain charges, for example, in a silicon oxide.

It is preferable to use the insulating film having therein the conductive film or semiconductor layer as a memory functional unit for the reason that an amount of injecting charges into the conductor or semiconductor can be freely controlled and multilevel values can be easily obtained.

Further, it is preferable to use the insulating film including at least one conductor or semiconductor dot as the memory functional unit for the reason that it becomes easier to perform writing and erasing by direct tunneling of charges, and reduction in power consumption can be achieved.

Alternately, as a memory functional unit, a ferroelectric film such as PZT or PLZT in which the polarization direction changes according to the electric field may be used. In this case, charges are substantially generated in the surface of the ferroelectric film by the polarization and are held in that state. It is therefore preferable since the ferroelectric film can obtain a hysteresis characteristic similar to that of a film to which charges are supplied from the outside of the film having the memory function and which traps charges. In addition, it is unnecessary to inject charges from the outside of the film in order to retain charges in the ferroelectric film, and the hysteresis characteristic can be obtained only by the polarization of the charge in the film, so that writing/erasing can be performed at high speed.

As the insulating film constructing the memory functional unit, a film having a region or function of suppressing escape of charges is suitable. An example of the film having the function of suppressing escape of charges includes a silicon oxide film.

The charge retaining film included in the memory functional unit is disposed on both sides of the gate electrode directly or via an insulating film, and is disposed on the semiconductor layer (semiconductor substrate, well region, body region or source/drain region, or diffusion region) directly or via a gate insulating film. Preferably, the charge retaining film on both sides of the gate electrode is formed so as to cover all or part of the sidewalls of the gate electrode directly or via the insulating film. In an application example, in the case where the gate electrode has a recess in its lower end, the charge retaining film may be formed so as to completely or partially bury the recess directly or via an insulating film.

Preferably, the gate electrode is formed only on the sidewalls of the memory functional unit as described later or does not cover the top part of the memory functional unit. By such arrangement, a contact plug can be disposed closer to the gate electrode, so that reduction in the size of the memory cell is facilitated. It is easy to manufacture the memory cell having such simple arrangement, so that the yield in production can be improved.

In the case of using a conductive film as the charge retaining film, preferably, the conductive film is disposed via an insulating film so that the charge retaining film is not in direct contact with the semiconductor layer (semiconductor substrate, well region, body region, source/drain regions or diffusion region) or a gate electrode. For example, a laminated structure of the conductive film and the insulating film, a structure in which conductive films in the form of dots are spread in the insulating film, a structure in which the conductive film is disposed in a part of a sidewall insulating film formed on sidewalls of the gate, and the like can be mentioned.

The source/drain regions can function as source and drain regions and have the conductive type opposite to that of the semiconductor layer or well region. In the junction, preferably, difference between impurity concentrations of the source/drain regions (diffusion regions) and the semiconductor layer or well region is high for the reason that hot electrons or hot holes are generated efficiently with low voltage, and high-speed operation can be performed with lower voltage. The junction depth of the source/drain regions is not particularly limited but can be appropriately adjusted in accordance with the performance or the like of a semiconductor memory device to be obtained. In the case of using an SOI substrate as a semiconductor substrate, the source/drain regions may have a junction depth smaller than the thickness of the surface semiconductor layer. It is preferable that the diffusion region has junction depth almost the same as that of the surface semiconductor layer.

The source/drain regions may be disposed so as to overlap with an end of the gate electrode, so as to match an end of the gate electrode, or so as to be offset from an end of the gate electrode. The case of offset is particularly preferable because easiness of inversion of the offset region below the charge retaining film largely changes in accordance with an amount of charges accumulated in the memory functional unit when voltage is applied to the gate electrode, the memory effect increases, and a short channel effect is reduced. However, when the diffusion region is offset too much, drive current between the source and drain decreases conspicuously. Therefore, it is preferable that the offset amount, that is, the distance to the source/drain regions closer to one of the gate electrode ends in the gate length direction is shorter than the thickness of the charge retaining film extending in the direction parallel with the gate length direction. It is particularly important that at least a part of the film or region having the charge retaining function in the memory functional unit is overlapped with part of the source/drain regions. This is because the essence of the memory cell as a component of the semiconductor memory device is to rewrite stored information by an electric field which is applied across the memory functional unit in accordance with the voltage difference between the gate electrode which exists only in the sidewall part of the memory functional unit and the source/drain regions.

A part of the source/drain regions may extend at a level higher than the surface of the channel region or the under face of the gate insulating film. In this case, it is suitable that, on the source/drain regions formed in the semiconductor substrate, the conductive film integrated with the source/drain regions are laminated. The conductive film may be made of semiconductor such as polysilicon or amorphous silicon, silicide, the above-described metals, high-refractory metals, or the like. In particular, polysilicon is preferred. Since impurity diffusion speed of polysilicon is much faster than that of the semiconductor layer, it is easy to make the junction depth of the source/drain regions in the semiconductor layer shallow and to suppress the short channel effect. In this case, preferably, a part of the source/drain regions are disposed so as to sandwich at least a part of the memory functional unit in cooperation with the gate electrode.

The memory cell of embodiments of the present invention can be formed by a normal semiconductor process, for example, a method similar to the method of forming the sidewall spacer having the single-layer or laminated structure on the sidewalls of the gate electrode. Concrete examples of the method include; a method of forming the gate electrode or the electrode, after that, forming a single-layer film or laminated film including the charge retaining film such as a charge retaining film, charge retaining film/insulating film, insulating film/charge retaining film, or insulating film/charge retaining film/insulating film, and etching back the formed film under suitable conditions so as to leave the films in a sidewall spacer shape; a method of forming an insulating film or charge retaining film, etching back the film under suitable conditions so as to leave the film in the sidewall spacer shape, further forming the charge retaining film or insulating film, and similarly etching back the film so as to leave the film in the sidewall spacer shape; a method of applying or depositing an insulating film material in which particles made of a charge retaining material are spread on the semiconductor layer including the gate electrode and etching back the material under suitable conditions so as to leave the insulating film material in a sidewall spacer shape; and a method of forming a gate electrode, after that, forming the single-layer film or laminated film, and patterning the film with a mask. According to another method, before the gate electrode or the electrode is formed, charge retaining film, charge retaining film/insulating film, insulating film/charge retaining film, insulating film/charge retaining film/insulating film, or the like is formed. An opening is formed in a region which becomes the channel region of these films, a gate electrode material film is formed on the entire surface of the opening, and the gate electrode material film is patterned in a shape including the opening and larger than the opening, thereby forming the gate electrode and the memory functional unit.

In the case of constructing the memory cell array by arranging memory cells of an embodiment of the present invention, the best mode of the memory cell satisfies all of the requirements: for example, ① the gate electrodes of a plurality of memory cells are integrated and have the function of a word line; ② the memory functional units are formed on both sides of the word line; ③ an insulator, particularly, a silicon nitride film retains charges in the memory functional unit; ④ the memory functional unit is constructed by an ONO (Oxide Nitride Oxide) film and the silicon nitride film has a surface substantially parallel with the surface of the gate insulating film; ⑤ a silicon nitride film in the memory functional unit is isolated from a word line and a channel region via a silicon oxide film; ⑥ the region having the function of retaining charge (example, region having the silicon nitride film) and a diffusion region in the memory functional unit are overlapped; ⑦ the thickness of the insulating film separating the silicon nitride film having the surface which is substantially parallel with the surface of the gate insulating film from the channel region or semiconductor layer and the thickness of the gate insulating film are different from each other; ⑧ an operation of writing/erasing one memory cell is performed by a single word line; ⑨ there is no electrode (word line) having the function of assisting the writing/erasing operation on the memory functional unit; and ⑩ in a portion in contact with the diffusion region immediately below the memory functional unit, a region of high concentration of impurity whose conductive type is opposite to that of the diffusion region is provided. Benefits are obtained even when fewer than all ten requirements are satisfied. It may be sufficient for the memory cell to satisfy even one of the requirements.

In the case where the memory cell satisfies the requirements ③ and ⑨, it is very useful for the following reasons. First, the bit line contact can be disposed closer to the memory functional unit on the word line sidewall or even when the distance between memory cells is shortened, a plurality of memory functional units do not interfere with each other, and stored information can be held. Therefore, reduction in size of the memory cell is facilitated. In the case where the charge retaining region in the memory functional unit is made of a conductor, as the distance between memory cells decreases, interference occurs between the charge retaining regions due to capacitive coupling, so that stored information cannot be held.

In the case where the charge retaining region in the memory functional unit is made of an insulator (for example, a silicon nitride film), it becomes unnecessary to make the memory functional unit independent for each memory cell. For example, the memory functional units formed on both sides of a single word line shared by a plurality of memory cells do not have to be isolated for each memory cell. The memory functional units formed on both sides of one word line can be shared by a plurality of memory cells sharing the word line. Consequently, a photo and etching process for isolating the memory functional unit becomes unnecessary, and the manufacturing process is simplified. Further, a margin for positioning in the photolithography process and a margin for film reduction by etching become unnecessary, so that the margin between neighboring memory cells can be reduced. Therefore, as compared with the case where the charge retaining region in the memory functional unit is made of a conductor (for example, polysilicon film), even when the memory functional unit is formed at the same microfabrication level, a memory cell occupied area can be reduced. In the case where the charge retaining region in the memory functional unit is made of a conductor, the photo and etching process for isolating the memory functional unit for each memory cell is necessary, and a margin for positioning in the photolithography process and a margin for film reduction by etching are necessary.

Moreover, since the electrode having the function of assisting the writing and erasing operations does not exist on the memory functional unit and the device structure is simple, the number of processes decreases, so that the yield in production can be increased. Therefore, it facilitates formation with a transistor as a component of a logic circuit or an analog circuit, and a cheap semiconductor memory device can be obtained.

Additional benefits are obtained when not only the requirements ③ and ⑨ but also the requirement ⑥ are satisfied.

Specifically, writing and erasing can be performed with a very low voltage by overlapping the charge retaining region in the memory functional unit and the diffusion region. Concretely, with a low voltage of 5 V or less, the writing and erasing operations can be performed. The action is a very large effect also from the viewpoint of circuit designing. Since it is unnecessary to generate a high voltage in a chip unlike a flash memory, a charge pumping circuit requiring a large occupation area can be omitted or its scale can be reduced. Particularly, when a memory of small-scale capacity is provided for adjustment in a logic LSI, as for an occupied area in a memory part, an occupation area of peripheral circuits for driving a memory cell is dominant more than that of a memory cell. Consequently, omission or down sizing of the charge pumping circuit for a memory cell is most effective to reduce the chip size.

On the other hand, in the case where the requirement ③ is not satisfied, that is, in the case where a conductor retains charges in the memory functional unit, even when the requirement ⑥ is not satisfied, specifically, even when the conductor in the memory functional unit and the diffusion region do not overlap with each other, writing operation can be performed at high speed. This is because conductor in the memory functional unit assists writing operation by capacitive coupling with the gate electrode.

In the case where the requirement ⑨ is not satisfied, specifically, in the case where the electrode having the function of assisting the writing and erasing operations exists on the memory functional unit, even when the requirement ⑥ is not satisfied, specifically, even when the insulator in the memory functional unit and the diffusion region do not overlap with each other, writing operation can be performed at high speed.

In short, in the case where the requirement ③ or ⑨ is not satisfied, even when the requirement ⑥ is not satisfied, writing operation can be performed at high speed. Not satisfying the requirement ③ or ⑨, however, causes increase in the occupation area of a memory cell. As clear from the above, it is preferable to satisfy the requirements ③, ⑥ and ⑨ at the same time.

In the semiconductor memory device of an embodiment of the present invention, a transistor may be connected in series with one of or both sides of a memory cell, or the memory cell may be mounted on the same chip with a logic transistor. In such a case, the semiconductor device, particularly, the memory cell can be formed by a process having high compatibility with a process of forming a normal standard transistor such as a transistor or a logic transistor, and they can therefore be formed simultaneously. Therefore, a process of forming both the memory cell and a transistor or a logic transistor is very simple and, as a result, a cheap embedded device can be obtained.

The memory cell can store information of two or more values in one memory functional unit. Thus, the memory cell can function as a memory cell for storing information of four or more values. The memory cell may store binary data only. The memory cell is also allowed to function as a memory cell having the functions of both a selection transistor and a memory transistor by a variable resistance effect of the memory functional unit.

The semiconductor memory device of embodiments of the present invention can be widely applied by being combined with a logic device, a logic circuit or the like to: a data processing system such as a personal computer, a note-sized computer, a laptop computer, a personal assistant/transmitter, a mini computer, a workstation, a main frame, a multi-processor/computer, a computer system of any other type, or the like; an electronic part as a component of the data processing system, such as a CPU, a memory or a data memory device; a communication apparatus such as a telephone, a PHS, a modem or a router; an image display apparatus such as a display panel or a projector; an office apparatus such as a printer, a scanner or a copier; an image pickup apparatus such as a video camera or a digital camera; an entertainment apparatus such as a game machine or a music player; an information apparatus such as a portable information terminal, a watch or an electronic dictionary; a vehicle-mounted apparatus such as a car navigation system or a car audio system; an AV apparatus for recording/reproducing information such as a motion picture, a still picture or music; an appliance such as a washing machine, a microwave, a refrigerator, a rice cooker, a dish washer, a vacuum cleaner or an air conditioner; a health managing apparatus such as a massage device, a bathroom scale or a manometer; and a portable memory device such as an IC card or a memory card. Particularly, it is effective to apply the semiconductor memory device to portable electronic apparatuses such as portable telephone, portable information terminal, IC card, memory card, portable computer, portable game machine, digital camera, portable motion picture player, portable music player, electronic dictionary and watch. The semiconductor memory device may be provided as at least a part of a control circuit or a data storing circuit of an electronic device or, as necessary, detachably assembled.

Hereinafter, embodiments of the semiconductor memory device, the display device and the portable electronic apparatus of embodiments of the present invention will be described in detail with reference to the drawings.

First Embodiment

A semiconductor memory device of a first embodiment has a memory cell 1 as shown in FIG. 1.

The memory cell 1 has a gate electrode 104 formed on a P-type well region 102 formed on the surface of a semiconductor substrate 101 via a gate insulating film 103. On the top face and side faces of the gate electrode 104, a silicon nitride film 109 having a trap level of retaining charges and serving as a charge retaining film is disposed. In the silicon nitride film 109, parts of both sidewalls of the gate electrode 104 serve as memory functional units 105a and 105b for actually retaining charges. The memory functional unit refers to a part in which charges are actually accumulated by rewriting operation in the memory functional unit or the charge retaining film. In the P-type well region 102 on both sides of the gate electrode 104, N-type diffusion regions 107a and 107b functioning as a source region and a drain region, respectively, are formed. Each of the diffusion regions 107a and 107b has an offset structure. Specifically, the diffusion regions 107a and 107b do not reach a region 121 below the gate electrode 104, and offset regions 120 below the charge retaining film construct part of the channel region.

Figure 2A:
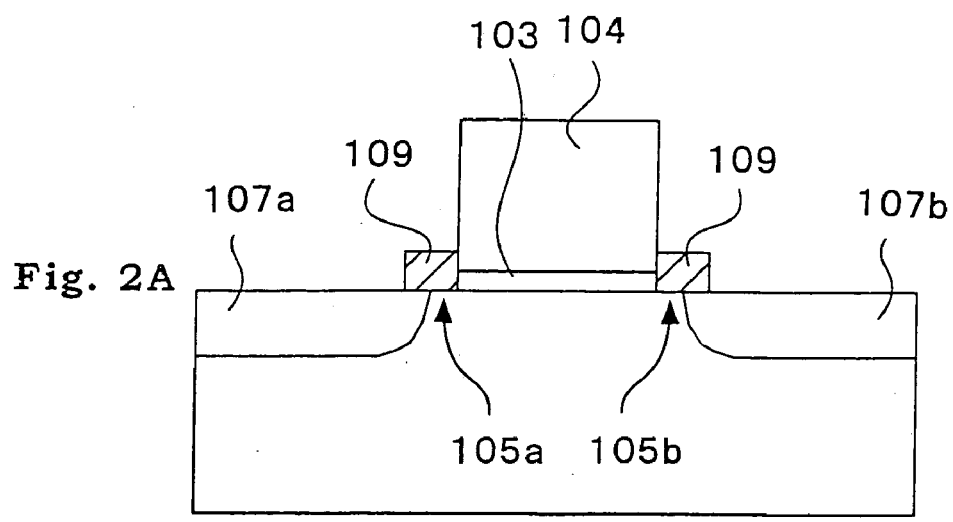
FIGS. 2A and 2B are schematic sectional views of principal portions of another memory cells constituted semiconductor memory devices of the present invention (first embodiment)
Figure 2B:
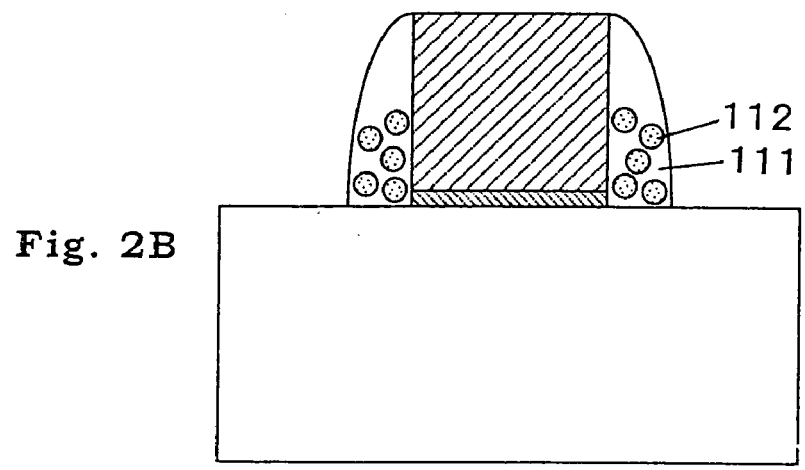

The memory functional units 105a and 105b for substantially retaining charges are the parts on both sidewalls of the gate electrode 104. It is therefore sufficient that the silicon nitride film 109 is formed only in regions corresponding to the parts (see FIG. 2A). Each of the memory functional units 105a and 105b may have a structure in which fine particles 111 each made of a conductor or semiconductor and having a nanometer size are distributed like discrete points in an insulating film 112 (see FIG. 2B). When the fine particle 111 has a size less than 1 nm, a quantum effect is too large, so that it becomes hard for charges to go(tunnel) to the dots. When the size exceeds 10 nm, a conspicuous quantum effect does not appear at room temperature. Therefore, the diameter of the fine particle 111 is preferably in a range from 1 nm to 10 nm. The silicon nitride film 109 serving as a charge retaining film may be formed in a sidewall spacer shape on a side face of the gate electrode (see FIG. 3).

The principle of the writing operation of the memory cell will be described with reference to FIGS. 3 and 4. The case where whole memory functional units 131a and 131b have the function of retaining charges will be described.

"Writing" denotes herein injection of electrons into the memory functional units 131a and 131b when the memory cell is of the N channel type. Hereinafter, on assumption that the memory cell is of the N channel type, description will be given.

Figure 3:
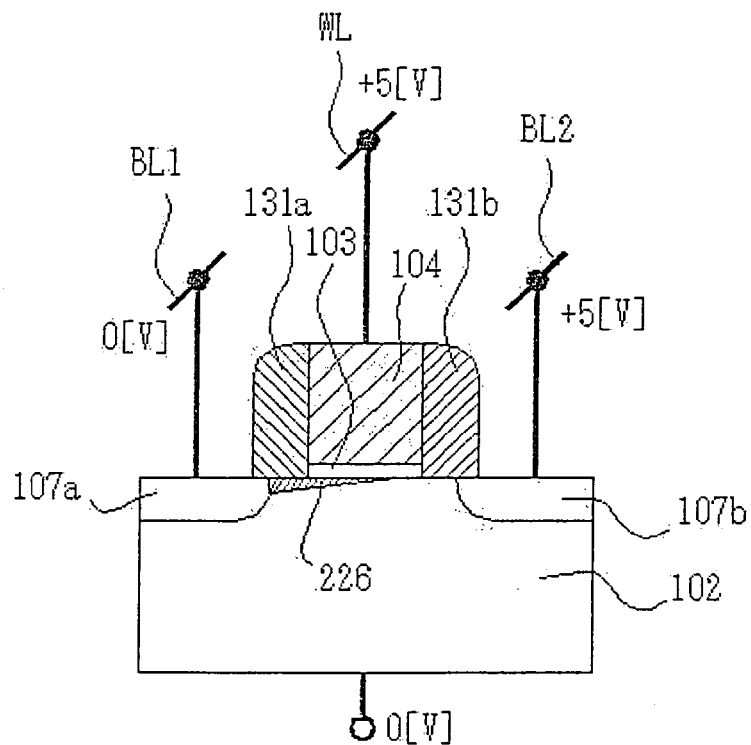
FIGS. 3 and 4 are views for illustrating writing operations of memory cells constituted semiconductor memory devices of the present invention (first embodiment)

As shown in FIG. 3, the first diffusion region 107a of the N type is set as a source electrode, and the second diffusion region 107b of the N type is set as a drain electrode, in order to inject electrons (write) the second memory functional unit 131b. For example, 0 V is applied to the first diffusion region 107a and the P-type well region 102, +5 V is applied to the second diffusion region 107b, and +5 V is applied to the gate electrode 104. Under such voltage parameters, an inversion layer 226 extends from the first diffusion region 107a (source electrode) but does not reach the second diffusion region 107b (drain electrode), and a pinch off point occurs. Electrons are accelerated from the pinch-off point to the second diffusion region 107b (drain electrode) by a high electric field, and become so-called hot electrons (high-energy conduction electrons). Writing is performed by injection of the hot electrons into the second memory functional unit 131b. Since hot electrons are not generated in the vicinity of the first memory functional unit 131a, writing is not performed.

As aforesaid, by injecting electrons into the second memory functional unit 131b, writing is performed.

Figure 4:
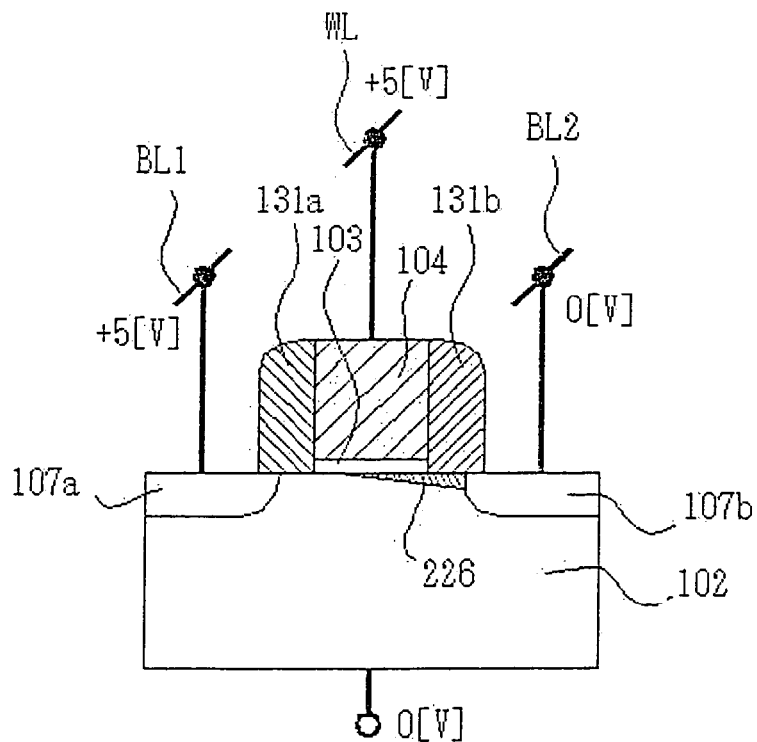

On the other hand, as shown in FIG. 4, the second diffusion region 107a is set as the source electrode, and the first diffusion region 107a is set as the drain electrode, in order to inject electrons (write) into the first memory functional unit 131a. For example, 0 V is applied to the second diffusion region 107b and the P-type well region 102, +5 V is applied to the first diffusion region 107a, and +5 V is applied to the gate electrode 104. Electrons are injected into the first memory functional unit 131a and writing can be performed by interchanging the source and drain regions so as to be different from the case of injecting electrons into the second memory functional unit 131b.

The principle of erasing operation of the memory cell will now be described with reference to FIGS. 5 and 6.

Figure 5:
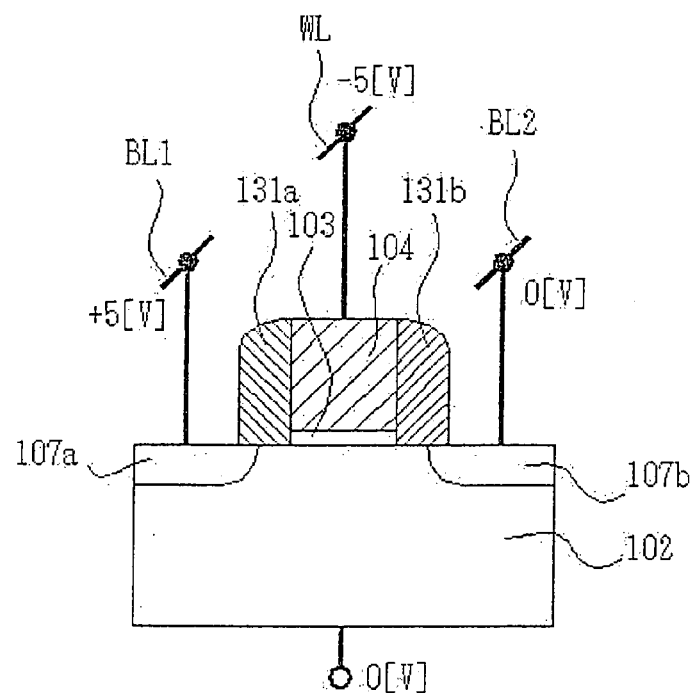
FIGS. 5 and 6 are views for illustrating erasing operations of memory cells constituted semiconductor memory devices of the present invention (first embodiment)

In a first method of erasing information stored in the first memory functional unit 131a, the PN junction between the first diffusion region 107a and the P-type well region 102 is reverse-biased and, further, negative voltage (for example, −5 V) is applied to the gate electrode 104, by applying positive voltage (for example, +5 V) to the first diffusion region 107a and applying 0 V to the P-type well region 102 as shown in FIG. 5. At this time, in the vicinity of the gate electrode 104 in the PN junction, due to the influence of the gate electrode to which the negative voltage is applied, particularly, gradient of potential becomes sharp. Consequently, hot holes (positive holes of high energy) are generated on the side of the P-type well region 102 of the PN junction by interband tunneling. The hot holes are attracted toward the gate electrode 104 having a negative potential and, as a result, the holes are injected to the first memory functional unit 131*a*. In such a manner, information in the first memory functional unit 131*a* is erased. At this time, to the second diffusion region 107*b*, it is sufficient to apply 0 V.

In the case of erasing information stored in the second memory functional unit 131*b*, the above-described operation is performed while interchanging the potential of the first diffusion region and that of the second diffusion region.

Figure 6:
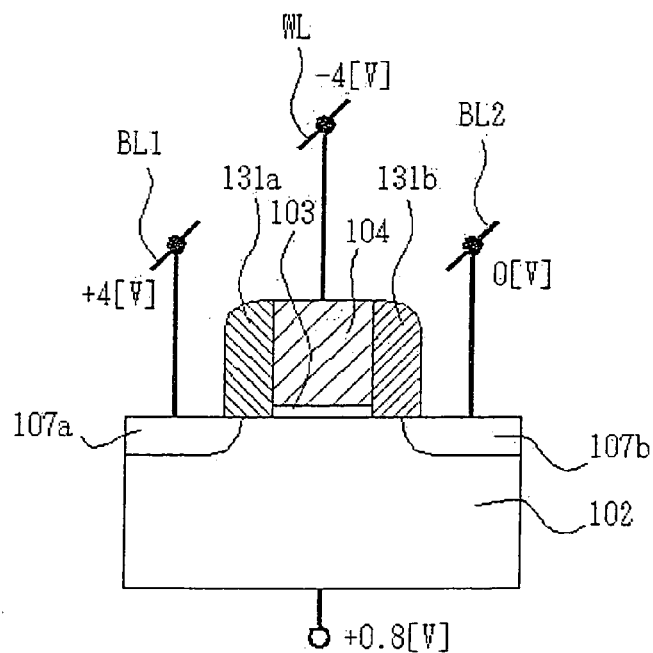

In a second method of erasing information stored in the first memory functional unit 131*a*, as shown in FIG. 6, positive voltage (for example, +4 V) is applied to the first diffusion region 107*a*, 0 V is applied to the second diffusion region 107*b*, negative voltage (for example, −4 V) is applied to the gate electrode 104, and positive voltage (for example, +0.8 V) is applied to the P-type well region 102. At this time, forward voltage is applied between the P-type well region 102 and the second diffusion region 107*b*, and electrons are injected to the P-type well region 102. The injected electrons are diffused to the PN junction between the P-type well region 102 and the first diffusion region 107*a*, where the electrons are accelerated by a strong electric field, thereby becoming hot electrons. By the hot electrons, an electron-hole pair is generated in the PN junction. Specifically, electrons injected in the P-type well region 102 become a trigger, and hot holes are generated in the PN junction positioned on the opposite side by applying forward voltage between the P-type well region 102 and the second diffusion region 107*b*. The hot holes generated in the PN junction are attracted toward the gate electrode 104 having the negative potential and, as a result, positive holes are injected into the first memory functional unit 131*a*.

According to the method, also in the case where only voltage insufficient to generate hot holes by interband tunneling is applied to the PN junction between the P-type well region and the first diffusion region 107*a*, electrons injected from the second diffusion region 107*b* become a trigger to generate an electron-positive hole pair in the PN junction, thereby enabling hot holes to be generated. Therefore, voltage in the erasing operation can be decreased. Particularly, in the case where the offset region 120 (see FIG. 1) exists, an effect that the PN junction becomes sharp by the gate electrode to which the negative potential is applied is low. Consequently, although it is difficult to generate hot holes by interband tunneling, by the second method, the disadvantage is overcome and the erasing operation can realized with low voltage.

In the case of erasing information stored in the first memory functional unit 131*a*, +5 V has to be applied to the first diffusion region 107*a* in the first erasing method whereas +4 V is sufficient in the second erasing method. As described above, according to the second method, the voltage at the time of erasing can be decreased, so that power consumption can be reduced and deterioration of the memory cell due to hot carriers can be suppressed.

In any of the erasing methods, over-erasure does not occur easily in the memory cell. The over-erasure herein denotes a phenomenon that as the amount of positive holes accumulated in the memory functional unit increases, the threshold decreases without saturation. The over-erasure is a big issue in an EEPROM typified by a flash memory. Particularly, in the case where the threshold becomes negative, critical malfunctioning that selection of a memory cell becomes impossible occurs. On the other hand, in the memory cell in the semiconductor memory device of embodiments of the present invention, also in the case where a large amount of positive holes are accumulated in the memory functional unit, only electrons are induced below the memory functional unit but an influence is hardly exerted to the potential in the channel region below the gate insulating film. Since the threshold at the time of erasing is determined by the potential below the gate insulating film, occurrence of over-erasure is suppressed.

Further, the principle of reading operation of the memory cell will be described with reference to FIG. 7.

Figure 7:
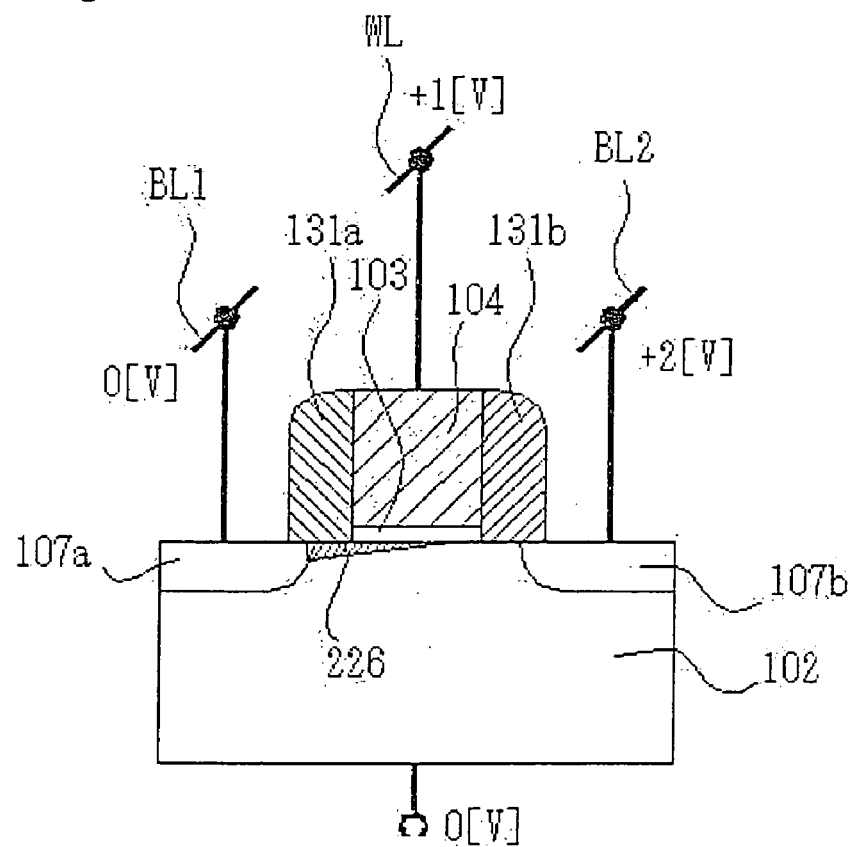
FIG. 7 is a view for illustrating a reading operation of a memory cell constituted a semiconductor memory device of the present invention (first embodiment)

In the case of reading information stored in the first memory functional unit 131*a* as shown in FIG. 7, the first diffusion region 107*a* is set as a source electrode, the second diffusion region 107*b* is set as a drain electrode, and the transistor is allowed to operate in a saturated region. For example, 0 V is applied to the first diffusion region 107*a* and the P-type well region 102, +1.8 V is applied to the second diffusion region 107*b*, and +2 V is applied to the gate electrode 104. In the case where electrons are not accumulated in the first memory functional unit 131*a* at this time, drain current is apt to flow. On the other hand, in the case where electrons are accumulated in the first memory functional unit 131*a*, an inversion layer is not easily formed in the vicinity of the first memory functional unit 131*a*, so that the drain current is not apt to flow. Therefore, by detecting the drain current, information stored in the first memory functional unit 131*a* can be read. The presence/absence of charge accumulation in the second memory functional unit 131*b* does not exert an influence on the drain current since the pinch-off point occurs in the area in the vicinity of the drain.

In the case of reading information stored in the second memory functional unit 131*b*, the second diffusion region 107*b* is set as a source electrode, the first diffusion region 107*a* is set as a drain electrode, and the transistor is operated in a saturated region. It is sufficient to apply, for example, 0V to the second diffusion region 107*b* and the P-type well region 102, +1.8 V to the first diffusion region 107*a*, and +2 V to the gate electrode 104. Information stored in the second memory functional unit 131*b* can be read by interchanging the source and drain regions of the case of reading information stored in the first memory functional unit 131*a*.

In the case where a channel region (offset region 120) which is not covered with the gate electrode 104 remains, in the channel region which is not covered with the gate electrode 104, an inversion layer is dissipated or formed according to the presence/absence of excessive charges in the memory functional units 131*a* and 131*b* and, as a result, large hysteresis (change in the threshold) is obtained. However, when the offset region 120 is too wide, the drain current largely decreases and reading speed becomes much slower. Therefore, it is preferable to determine the width of the offset region 120 so as to obtain sufficient hysteresis and reading speed.

Also in the case where the diffusion regions 107*a* and 107*b* reach ends of the gate electrode 104, that is, the diffusion regions 107*a* and 107*b* overlap with the gate electrode 104, the threshold of the transistor hardly changes by the writing operation. However, parasitic resistance at the source/drain ends largely changes, and the drain current largely decreases (by equal to or more than one digit). Therefore, reading can be performed by detecting the drain current, and the function as a memory can be obtained. In the case where a larger memory hysteresis effect is necessary, it is preferable that the diffusion regions 107a and 107b and the gate electrode 104 are not overlapped (offset region 120 exists).

By the above operating method, two bits can be written/erased selectively per one transistor. A memory cell array can be constructed by connecting a word line WL to the gate electrode 104 of the memory cell, connecting a first bit line BL1 to the first diffusion region 107a, connecting a second bit line BL2 to the second diffusion region 107b, and arranging memory cells.

In the above-described operating method, writing and erasing of two bits per one transistor are performed by interchanging the source electrode and the drain electrode. Alternately, the transistor may operate as a 1-bit memory by fixing the source electrode and the drain electrode. In this case, common fixed voltage can be applied to one of the source and drain regions, so that the number of bit lines connected to the source/drain regions can be reduced to the half.

As should be apparent from the above description, in the memory cell in the semiconductor memory device of embodiments of the present invention, the memory functional unit is formed independently of the gate insulating film, and is formed on both sides of the gate electrode, so that 2-bit operation is possible. Since each memory functional unit is isolated by the gate electrode, interference at the time of rewriting is effectively suppressed. Further, since the gate insulating film is isolated from the memory functional unit, it can be formed thinly and a short channel effect can be suppressed. Therefore, reduction in size of the memory cell and, accordingly, the semiconductor memory device can be achieved easily.

Second Embodiment

Figure 8:
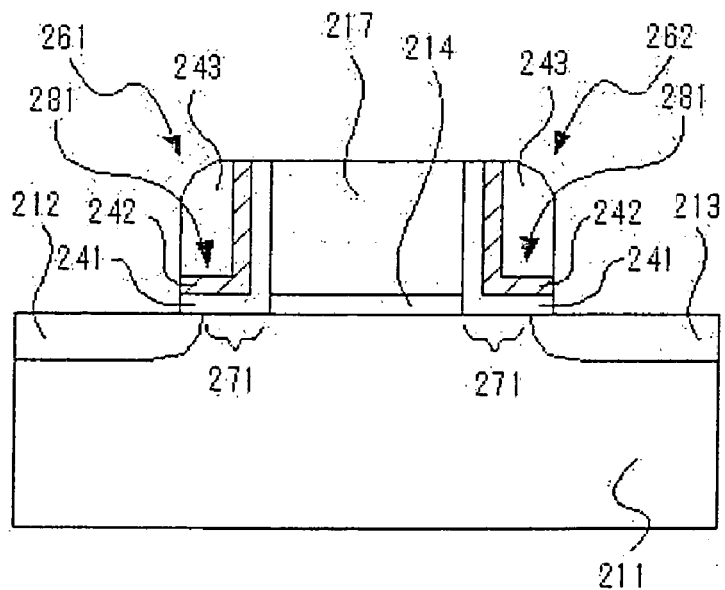
FIG. 8 is a schematic sectional view of a principal portion of a memory cell constituted a semiconductor memory device of the present invention (second embodiment)

A memory cell in a semiconductor memory device according to a second embodiment has a configuration substantially similar to that of the memory cell 1 of FIG. 1 except that, as shown in FIG. 8, each of memory functional units 261 and 262 is constructed by a charge retaining region (which is a charge accumulating region and may be a film having the function of retaining charges) and a region for suppressing escape of charges (or a film having the function of suppressing escape of charges).

From the viewpoint of improving a memory retention characteristic, preferably, the memory functional unit includes a charge retaining film having the function of retaining charges and an insulating film. In the second embodiment, a silicon nitride film 242 having a level of trapping charges is used as the charge retaining film, and silicon oxide films 241 and 243 having the function of preventing dissipation of charges accumulated in the charge retaining are used as insulating films. The memory functional unit includes the charge retaining film and the insulating films, thereby preventing dissipation of charges, and the retention characteristic can be improved. The volume of the charge retaining film can be appropriately reduced, movement of charges in the charge retaining film can be regulated, and occurrence of a characteristic change due to charge movement during retention of information can be suppressed, as compared with the case where the memory functional unit is constructed only by the charge retaining film. Further, charge injecting efficiency at the time of rewriting operation becomes high by employing the structure in which the silicon nitride film 242 is sandwiched by the silicon oxide films 241 and 243, so that higher-speed operation can be performed. In the memory cell, the silicon nitride film 242 may be replaced with a ferroelectric.

The regions for retaining charges (silicon nitride films 242) in the memory functional units 261 and 262 overlap with diffusion regions 212 and 213. The overlap denotes herein that at least a part of the region for retaining charges (silicon nitride film 242) exists over at least a part of the diffusion regions 212 and 213. A reference numeral 211 denotes a semiconductor substrate, a reference numeral 214 denotes a gate insulating film, a reference numeral 217 denotes a gate electrode, and a reference numeral 271 indicates an offset region between the gate electrode 217 and the diffusion regions 212 and 213. Although not shown, the surface of the semiconductor substrate 211 under the gate insulating film 214 serves as a channel region.

An effect obtained when the silicon nitride films 242 as regions for retaining charges in the memory functional units 261 and 262 overlap with the diffusion regions 212 and 213 will be described.

Figure 9:
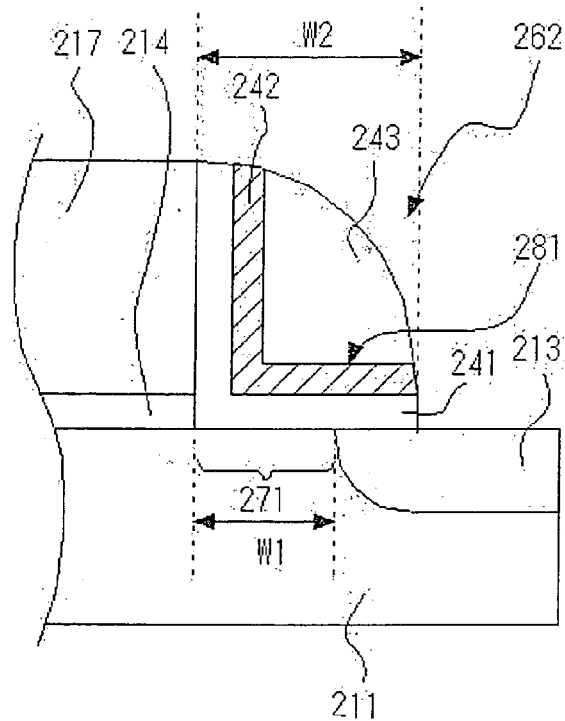
FIG. 9 is a schematic enlarged sectional view of a principal portion of a memory cell in FIG. 8.

As shown in FIG. 9, in an area around the memory functional unit 262, when an offset amount between the gate electrode 217 and the diffusion region 213 is W1 and the width of the memory functional unit 262 in a cross section in the channel length direction of the gate electrode is W2, the overlap amount between the memory functional unit 262 and the diffusion region 213 is expressed as W2−W1. It is important herein that the memory functional unit 262 constructed by the silicon oxide film 242 overlaps with the diffusion region 213, that is, the relation of W2>W1 is satisfied.

In FIG. 9, an end on the side apart from the gate electrode 217 of the silicon nitride film 242 in the memory functional unit 262 matches with the end of the memory functional unit 262 on the side apart from the gate electrode 217, so that the width of the memory functional unit 262 is defined as W2.

Figure 10:
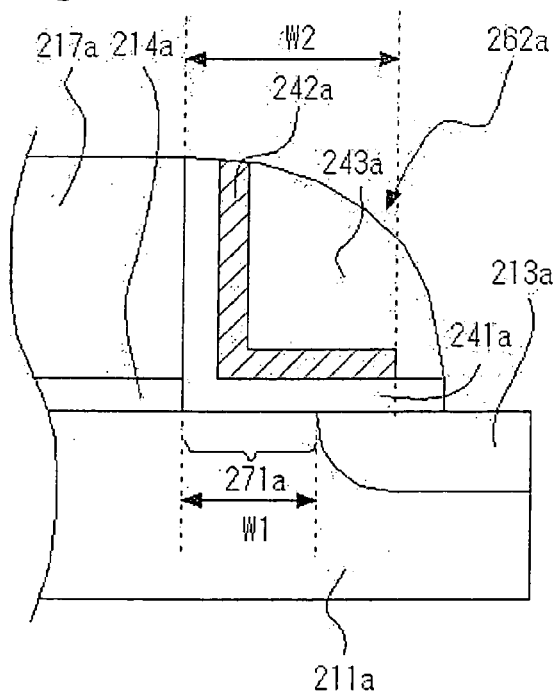
FIG. 10 is a schematic enlarged sectional view of a principal portion of a memory cell constituted a semiconductor memory device of the present invention (second embodiment).

As shown in FIG. 10, when the end on the side apart from the gate electrode of a silicon nitride film 242a in a memory functional unit 262a does not match with the end of the memory functional unit 262a on the side apart from the gate electrode, W2 may be defined as a distance from the gate electrode end to an end on the side apart from the gate electrode of the silicon nitride film 242a.

Figure 11:
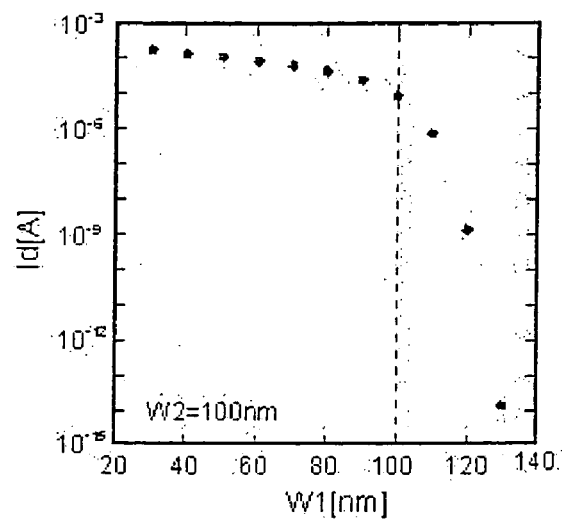
FIG. 11 is a diagram showing an electric characteristic of a memory cell constituted a semiconductor memory device of the present invention (second embodiment)

FIG. 11 shows drain current Id when the width W2 of the memory functional unit 262 is fixed to 100 nm and the offset amount W1 is changed in the structure of the memory cell of FIG. 9. Herein, the drain current was obtained by device simulation on assumption that the memory functional unit 262 is in erasing state (holes are accumulated), and the diffusion regions 212 and 213 serve as the source electrode and the drain electrode, respectively.

As obvious from FIG. 11, in the range where W1 is 100 nm or more (that is, the silicon nitride film 242 and the diffusion region 213 do not overlap with each other), the drain current sharply decreases. Since the drain current value is almost proportional to the reading operation speed, the performance of the memory sharply deteriorates with W1 of 100 nm or more. On the other hand, in the range where the silicon nitride film 242 and the diffusion region 213 overlap with each other, decrease in the drain current is gentle. Therefore, in the case of considering also variations in mass production, if at least a part of the silicon nitride film 242 as the film having the function of retaining charges does not overlap with the source and drain regions, it is difficult to obtain the memory function in reality.

On the basis of the result of the device simulation, memory cell arrays were produced by fixing W2 to 100 nm and setting W1 to 60 nm and 100 nm as design values. In the case where W1 is 60 nm, the silicon nitride film 242 and the diffusion regions 212 and 213 overlap with each other by 40 nm as a design value. In the case where W1 is 100 nm, there is no overlap as a design value. Reading time of the memory cell arrays was measured and worst cases considering variations were compared with each other. In the where W1 is set to 60 nm as a design value, read access time is 100 times as fast as that of the other case. In practice, the read access time is preferably 100 nsec or less per one bit. When W1=W2, the condition cannot be achieved. In the case of considering manufacture variations as well, it is more preferable that (W2−W1)>10 nm.

To read information stored in the memory functional unit 261 (region 281), in a manner similar to the first embodiment, it is preferable to set the diffusion region 212 as a source electrode, set the diffusion region 213 as a drain region, and form a pinch-off point on the side closer to the drain region in the channel region. Specifically, at the time of reading information stored in one of the two memory functional units, it is preferable to form the pinch-off point in a region closer to the other memory functional unit, in the channel region. With the arrangement, irrespective of a storage state of the memory functional unit 262, information stored in the memory functional unit 261 can be detected with high sensitivity, and it is a large factor to achieve 2-bit operation.

On the other hand, in the case of storing information only one of two memory functional units or in the case of using the two memory functional units in the same storage state, it is not always necessary to form the pinch-off point at the time of reading.

Although not shown in FIG. 8, it is preferable to form a well region (P-type well in the case of the N channel device) in the surface of the semiconductor substrate 211. By forming the well region, it becomes easy to control the other electric characteristics (withstand voltage, junction capacitance and short-channel effect) while setting the impurity concentration in the channel region optimum to the memory operations (rewriting operation and reading operation).

From the viewpoint of improving a memory retention characteristic, preferably, the memory functional unit includes a charge retaining film having the function of retaining charges and an insulating film. In the second embodiment, a silicon nitride film 242 having a level of trapping charges is used as the charge retaining film, and silicon oxide films 241 and 243 having the function of preventing dissipation of charges accumulated in the charge retaining are used as insulating films. The memory functional unit includes the charge retaining film and the insulating films, thereby preventing dissipation of charges, and the retention characteristic can be improved. The volume of the charge retaining film can be appropriately reduced, movement of charges in the charge retaining film can be regulated, and occurrence of a characteristic change due to charge movement during retention of information can be suppressed, as compared with the case where the memory functional unit is constructed only by the charge retaining film.

Figure 12:
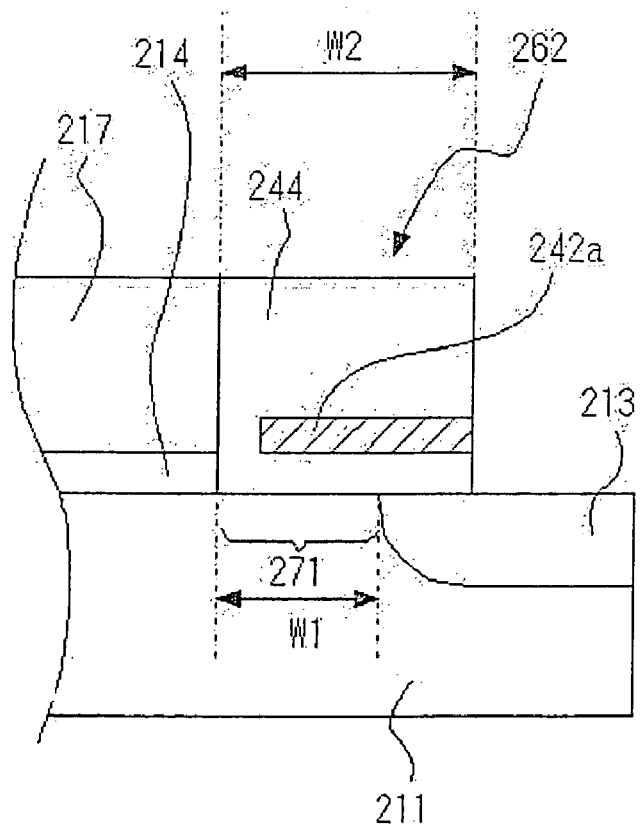
FIG. 12 is a schematic sectional view of a principal portion of an another memory cell constituted a semiconductor memory device of the present invention (second embodiment)

The memory functional unit preferably includes the charge retaining film disposed substantially in parallel with the gate insulating film surface. In other words, it is preferable that the level of the top face of the charge retaining film in the memory functional unit is positioned parallel to the level of the top face of the gate insulating film. Concretely, as shown in FIG. 12, the silicon nitride film 242a as a charge retaining film of the memory functional unit 262 has a surface substantially parallel with the surface of the gate insulating film 214. In other words, it is preferable that the silicon nitride film 242a is formed at a level parallel to the level corresponding to the surface of the gate insulating film 214.

Formation easiness of the inversion layer in the offset region 271 can be effectively controlled in accordance with the more or less of an amount of charges accumulated in the silicon nitride film 242a by the existence of the silicon nitride film 242a substantially parallel to the surface of the gate insulating film 214 in the memory functional unit 262. Thus, the memory effect can be increased. Even in the case where the offset amount (W1) varies, a change in the memory effect can be maintained relatively small, and variations of the memory effect can be suppressed, by forming the silicon nitride film 242a substantially in parallel with the surface of the gate insulating film 214. Moreover, movement of the charges upward in the silicon nitride film 242a is suppressed, and occurrence of a characteristic change due to the charge movement during retention of information can be suppressed.

Preferably, the memory functional unit 262 includes an insulating film (for example, portion on the offset region 271 in the silicon oxide film 244) for separating the silicon nitride film 242a which is substantially parallel to the surface of the gate insulating film 214 from the channel region (or well region). By the insulating film, dissipation of the charges accumulated in the charge retaining film is suppressed and a memory cell having a better retention characteristic can be obtained.

The distance from the surface of the semiconductor substrate to charges accumulated in the charge retaining film can be maintained substantially constant by controlling the thickness of the silicon nitride film 242a and controlling the thickness of the insulating film below the silicon nitride film 242a (portion on the offset region 271 in the silicon oxide film 244) to be constant. To be specific, the distance from the surface of the semiconductor substrate to the charges accumulated in the charge retaining film can be controlled in a range from the minimum thickness value of the insulating film under the silicon nitride film 242a to the sum of the maximum thickness value of the insulating film under the silicon nitride film 242a and the maximum thickness value of the silicon nitride film 242a. Consequently, density of electric lines of force generated by the charges accumulated in the silicon nitride film 242a can be substantially controlled, and variations in the memory effect of the memory cell can be reduced very much.

Third Embodiment

Figure 13:
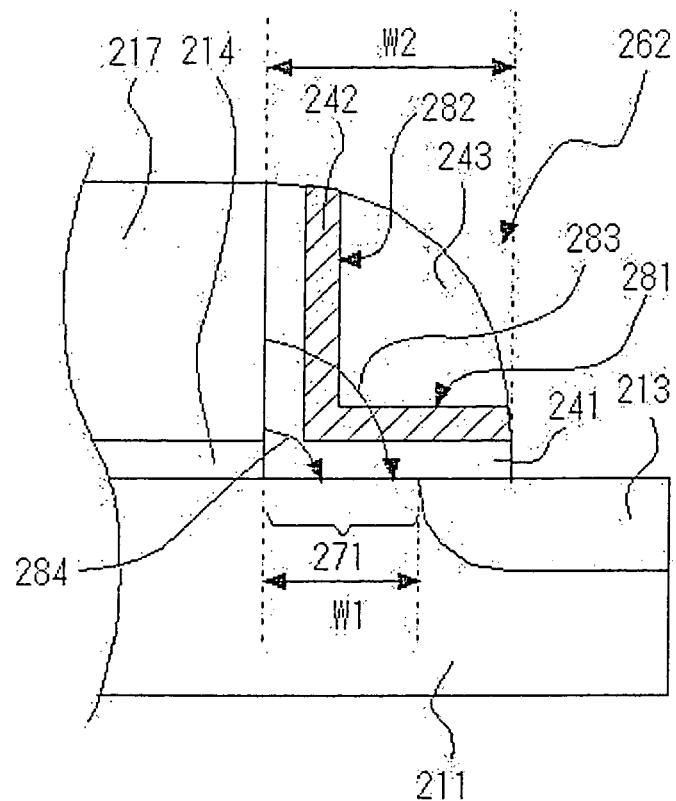
FIG. 13 is a schematic sectional view of a principal portion of a memory cell constituted a semiconductor memory device of the present invention (third embodiment)

The memory functional unit 262 in a semiconductor memory device of a third embodiment has a shape in which the silicon nitride film 242 as a charge retaining film has substantially uniform thickness and is disposed substantially in parallel with the surface of the gate insulating film 214 as shown in FIG. 13 (region 281) and, further, substantially in parallel with a side face of the gate electrode 217 (region 282).

In the case where positive voltage is applied to the gate electrode 217, an electric line 283 of force in the memory functional unit 262 passes the silicon nitride film 242 twice (regions 282 and 281) as shown by an arrow. When negative voltage is applied to the gate electrode 217, the direction of the electric line of force becomes opposite. Herein, the dielectric constant of the silicon nitride film 242 is about 6, and that of silicon oxide films 241 and 243 is about 4. Therefore, effective dielectric constant of the memory functional unit 262 in the direction of the electric line 283 of force is higher and the potential difference at both ends of the electric line of force can be reduced more as compared with the case where only the region 281 of the charge retaining film exists. In other words, a large part of the voltage applied to the gate electrode 217 is used to enhance the electric field in the offset region 271.

The reason why charges are injected to the silicon nitride film 242 in the rewriting operation is because generated charges are attracted by the electric field in the offset region 271. Therefore, charges injected into the memory functional unit 262 increase in the rewriting operation, and the rewriting speed increases, by including the charge retaining film shown by the arrow 282.

In the case where the portion of the silicon oxide film 243 is also the silicon nitride film, that is, in the case where the level of the charge retaining film is not parallel with the level corresponding to the surface of the gate insulating film 214, upward movement of charges in the silicon nitride film becomes conspicuous, and the retention characteristic deteriorates.

More preferably, in place of the silicon nitride film, the charge retaining film is made of a high dielectric such as hafnium oxide having a very high dielectric constant.

It is preferable that the memory functional unit further includes an insulating film (portion on the offset region 271 in the silicon oxide film 241) for separating the charge retaining film substantially parallel to the surface of the gate insulating film from the channel region (or well region). By the insulating film, dissipation of charges accumulated in the charge retaining film is suppressed, and the retention characteristic can be further improved.

Preferably, the memory functional unit further includes an insulating film (portion in contact with the gate electrode 217 in the silicon oxide film 241) for separating the gate electrode from the charge retaining film extended substantially parallel with the side face of the gate electrode. The insulating film prevents injection of charges from the gate electrode into the charge retaining film and accordingly prevents a change in the electric characteristics. Thus, the reliability of the memory cell can be improved.

Further, in a manner similar to the second embodiment, it is preferable to control the thickness of the insulating film under the silicon nitride film 242 (portion on the offset region 271 in the silicon oxide film 241) to be constant and to control the thickness of the insulating film on the side face of the gate electrode (portion in contact with the gate electrode 217 in the silicon oxide film 241) to be constant. Consequently, the density of the electric lines of force generated by the charges accumulated in the silicon nitride film 242 can be substantially controlled, and charge leak can be prevented.

Fourth Embodiment

In a fourth embodiment, optimization of the gate electrode, the memory functional unit, and the distance between the source and drain regions of a memory cell in a semiconductor memory device will be described.

Figure 14:
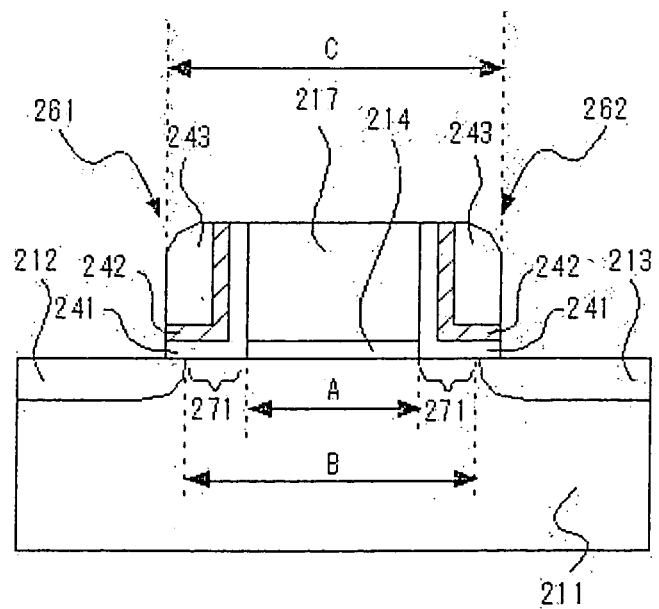
FIG. 14 is a schematic sectional view of a principal portion of a memory cell constituted a semiconductor memory device of the present invention (forth embodiment)

As shown in FIG. 14, a reference character A denotes length of the gate electrode in a cut surface in the channel length direction, a reference character B denotes the distance between the source and drain regions (channel length), and a reference character C denotes the distance from the end of one of memory functional units to the end of the other memory functional unit, that is, the distance between the end (on the side far from the gate electrode) of a film having the function of retaining charges in one of memory functional units to the end (on the side apart from the gate electrode) of a film having the function of retaining charges in the other memory functional unit in a cut surface in the channel length direction.

In such a memory cell, B<C is preferable. By satisfying such a relation, the offset regions 271 exist between the portion under the gate electrode 217 in the channel region and the diffusion regions 212 and 213. Consequently, easiness of inversion effectively fluctuates in the whole offset regions 271 by charges accumulated in the memory functional units 261 and 262 (silicon nitride films 242). Therefore, the memory effect increases and, particularly, higher-speed reading operation is realized.

In the case where the gate electrode 217 and the diffusion regions 212 and 213 are offset from each other, that is, in the case where the relation of A<B is satisfied, easiness of inversion in the offset region when voltage is applied to the gate electrode largely varies according to an amount of charges accumulated in the memory functional unit, so that the memory effect increases, and the short channel effect can be reduced.

However, as long as the memory effect appears, the offset region 271 does not always have to exist. Also in the case where the offset region 271 does not exist, if the impurity concentration in the diffusion regions 212 and 213 is sufficiently low, the memory effect can be exhibited in the memory functional units 261 and 262 (silicon nitride films 242).

Therefore, A<B<C is the most preferable.

Fifth Embodiment

Figure 15:
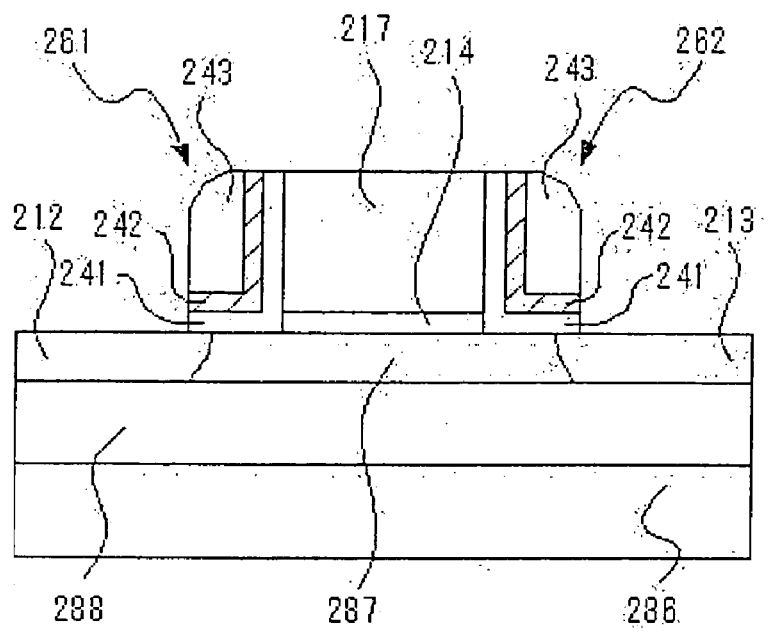
FIG. 15 is a schematic sectional view of a principal portion of a memory cell constituted a semiconductor memory device of the present invention (fifth embodiment)

A memory cell of a semiconductor memory device in a fifth embodiment has a substantially similar configuration to that of the second embodiment except that an SOI substrate is used as the semiconductor substrate in the second embodiment as shown in FIG. 15.

In the memory cell, a buried oxide film 288 is formed on a semiconductor substrate 286, and an SOI layer is formed on the buried oxide film 288. In the SOI layer, the diffusion regions 212 and 213 are formed and the other region is a body region 287.

By the memory cell as well, action and effect similar to those of the memory cell of the second embodiment are obtained. Further, junction capacitance between the diffusion regions 212 and 213 and the body region 287 can be remarkably reduced, so that higher-speed operation and lower power consumption of the device can be achieved.

Sixth Embodiment

Figure 16:
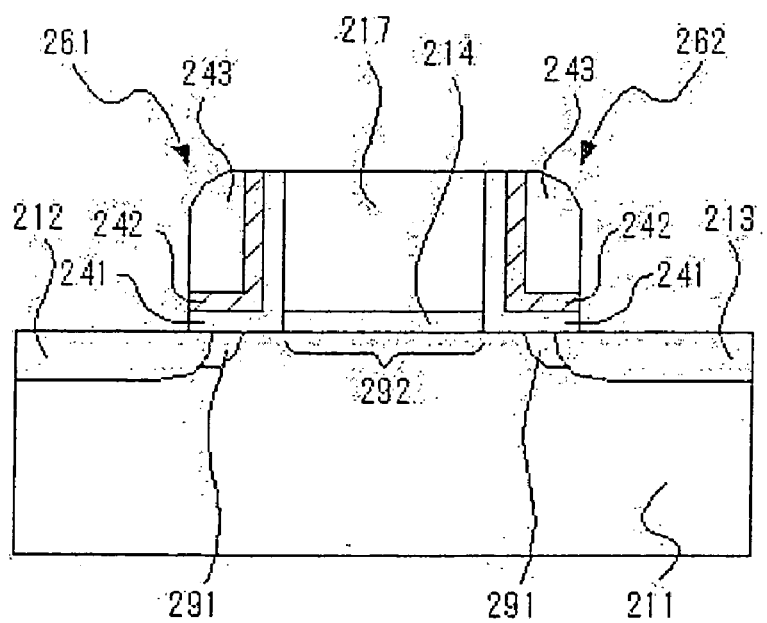
FIG. 16 is a schematic sectional view of a principal portion of a memory cell constituted a semiconductor memory device of the present invention (sixth embodiment)

A memory cell in a semiconductor memory device in a sixth embodiment has, as shown in FIG. 16, a configuration substantially similar to that of the memory cell of the second embodiment except that a P-type high-concentration region 291 is added adjacent to the channel sides of the N-type diffusion regions 212 and 213.

Specifically, the concentration of a P-type impurity (for example, boron) in the P-type high-concentration region 291 is higher than that of a P-type impurity in a region 292. Suitable P-type impurity concentration in the P-type high-concentration region 291 is, for example, about $5 \times 10^{17}$ to $1 \times 10^{19}$ cm$^{-3}$. The P-type impurity concentration of the region 292 can be set to, for example, $5 \times 10^{16}$ to $1 \times 10^{18}$ cm$^{-3}$.

By providing the P-type high-concentration region 291, the junction between the diffusion regions 212 and 213 and the semiconductor substrate 211 becomes sharp below the memory functional units 261 and 262. Consequently, hot carriers are easily generated in the writing and erasing operations, the voltage of the writing and erasing operations can be decreased or the writing operation and the erasing operation can be performed at high speed. Moreover, since the impurity concentration in the region 292 is relatively low, the threshold when the memory is in the erasing state is low, and the drain current is large. Consequently, the reading speed is improved. Therefore, the memory cell with low rewriting voltage or high rewriting speed and high reading speed can be obtained.

In FIG. 16, the threshold of the whole transistor remarkably increases, by providing the P-type high-concentration region 291 in the vicinity of the source/drain regions and below the memory functional unit (that is, not immediately below the gate electrode). The degree of increase is much higher than that in the case where the P-type high-concentration region 291 is positioned immediately below the gate electrode. In the case where write charges (electrons when the transistor is of the N-channel type) are accumulated in the memory functional unit, the difference becomes larger. On the other hand, in the case where sufficient erasing charges (positive holes when the transistor is of the N-channel type) are accumulated in the memory functional unit, the threshold of the whole transistor decreases to a threshold determined by the impurity concentration in the channel region (region 292) below the gate electrode. That is, the threshold in the erasing operation does not depend on the impurity concentration of the P-type high-concentration region 291 whereas the threshold in the writing operation is largely influenced. Therefore, only the threshold in the writing operation largely fluctuates, and the memory effect (the difference between the threshold in the writing operation and that in the erasing operation) can be remarkably increased, by disposing the P-type high-concentration region 291 under the memory functional unit and in the vicinity of the source/drain regions.

Seventh Embodiment

Figure 17:
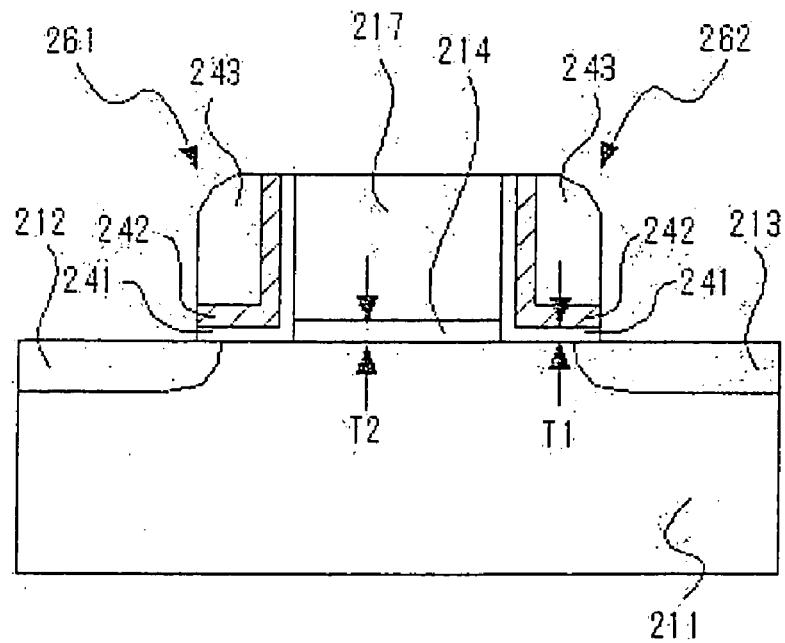
FIG. 17 is a schematic sectional view of a principal portion of a memory cell constituted a semiconductor memory device of the present invention (seventh embodiment)

A memory cell in a semiconductor memory device of a seventh embodiment has a configuration substantially similar to that of the second embodiment except that, as shown in FIG. 17, the thickness (T1) of an insulating film separating the charge retaining film (silicon nitride film 242) from the channel region or well region is smaller than the thickness (T2) of the gate insulating film.

The thickness T2 of the gate insulating film 214 has the lower limit value from the demand of withstand voltage at the time of rewriting operation of the memory. However, the thickness T1 of the insulating film can be made smaller than T2 irrespective of the demand of withstand voltage.

The flexibility of designing with respect to T1 is high in the memory cell for the following reason.

In the memory cell, the insulating film for separating the charge retaining film from the channel region or well region is not sandwiched by the gate electrode and the channel region or well region. Consequently, to the insulating film for separating the charge retaining film from the channel region or well region, a high electric field acting between the gate electrode and the channel region or well region does not directly act, but a relatively low electric field spreading from the gate electrode in the lateral direction acts. Consequently, irrespective of the demand of withstand voltage to the gate insulating film, T1 can be made smaller than T2.

By making T1 thinner, injection of charges into the memory functional unit becomes easier, the voltage of the writing operation and the erasing operation is decreased or the writing operation and erasing operation can be performed at high speed. Since the amount of charges induced in the channel region or well region when charges are accumulated in the silicon nitride film 242 increases, the memory effect can be increased.

The electric lines of force in the memory functional unit include a short one which does not pass through the silicon nitride film 242 as shown by an arrow 284 in FIG. 13. On the relatively short electric line of force, electric field intensity is relatively high, so that the electric field along the electric line of power plays a big role in the rewriting operation. By reducing T1, the silicon nitride film 242 is positioned downward in the figure, and the electric line of force indicated by the arrow 283 passes through the silicon nitride film. Consequently, the effective dielectric constant in the memory functional unit along the electric line 284 of force increases, and the potential difference at both ends of the electric line of force can be further decreased. Therefore, a large part of the voltage applied to the gate electrode 217 is used to increase the electric field in the offset region, and the writing operation and the erasing operation become faster.

In contrast, for example, in an EEPROM typified by a flash memory, the insulating film separating the floating gate and the channel region or well region is sandwiched by the gate electrode (control gate) from the channel region or well region, so that a high electric field from the gate electrode directly acts. Therefore, in an EEPROM, the thickness of the insulating film separating the floating gate from the channel region or well region is regulated, and optimization of the function of the memory cell is inhibited. As clear from the above, an essential reason for increasing the flexibility of T1 is that the insulating film separating the charge retaining film and the channel region or well region is not sandwiched between the gate electrode and the channel region or well region.

As should be clear from the above, by setting T1<T2, without deteriorating the withstand voltage performance of the memory, the voltage of the writing and erasing operations is decreased, or the writing operation and erasing operation are performed at high speed and, further, the memory effect can be increased.

More preferably, the thickness T1 of the insulating film is 0.8 nm or more at which uniformity or quality by a manufacturing process can be maintained at a predetermined level and which is the limitation that the retention characteristic does not deteriorate extremely.

Concretely, in the case of a liquid crystal driver LSI requiring high withstand voltage in a large design rule, to drive the liquid crystal panel TFT, voltage of 15 to 18 V at the maximum is required normally, so that the gate oxide film cannot be thinned normally. In the case of mounting a nonvolatile memory for image adjustment on the liquid crystal driver LSI, in the memory cell of the present invention, the thickness of the insulating film separating the charge retaining film (silicon nitride film 242) from the channel region or well region can be designed optimally independently of the thickness of the gate insulating film. For example, the thickness can be individually set as T1=20 nm and T2=10 nm for a memory cell having a gate electrode length (word line width) of 250 nm, so that a memory cell having high writing efficiency can be realized (the reason why the short channel effect is not produced when T1 is larger than the thickness of a normal logic transistor is because the source and drain regions are offset from the gate electrode).

Eighth Embodiment

Figure 18:
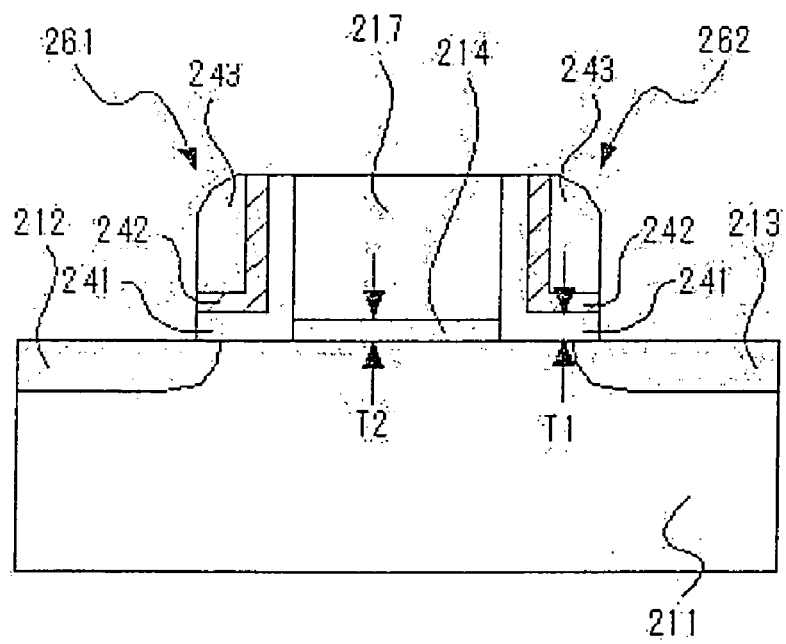
FIG. 18 is a schematic sectional view of a principal portion of a memory cell constituted a semiconductor memory device of the present invention (eighth embodiment)

A memory cell in a semiconductor memory device of an eighth embodiment has a configuration substantially similar to that of the second embodiment except that, as shown in FIG. 18, the thickness (T1) of the insulating film separating the charge retaining film (silicon nitride film 242) from the channel region or well region is larger than the thickness (T2) of the gate insulating film.

The thickness T2 of the gate insulating film 214 has an upper limit value due to demand of preventing a short channel effect of the cell. However, the thickness T1 of the insulating film can be made larger than T2 irrespective of the demand of preventing the short channel effect. Specifically, when reduction in scaling progresses (when reduction in thickness of the gate insulating film progresses), the thickness of the insulating film separating the charge retaining film (silicon nitride film 242) from the channel region or well region can be designed optimally independent of the gate insulating film thickness. Thus, an effect that the memory functional unit does not disturb scaling is obtained.

The reason why flexibility of designing T1 is high in the memory cell is that, as described already, the insulating film separating the charge retaining film from the channel region or well region is not sandwiched by the gate electrode and the channel region or well region. Consequently, irrespective of the demand of preventing the short channel effect for the gate insulating film, T1 can be made thicker than T2.

By making T1 thicker, dissipation of charges accumulated in the memory functional unit can be prevented and the retention characteristic of the memory can be improved.

Therefore, by setting T1>T2, the retention characteristic can be improved without deteriorating the short channel effect of the memory.

The thickness T1 of the insulating film is, preferably, 20 nm or less in consideration of decrease in rewriting speed.

Concretely, in a conventional nonvolatile memory typified by a flash memory, a selection gate electrode serves as a write erase gate electrode, and a gate insulating film (including a floating gate) corresponding to the write erase gate electrode also serves as a charge accumulating film. Since a demand for size reduction (thinning of a film is indispensable to suppress short channel effect) and a demand for assuring reliability (to suppress leak of retained charges, the thickness of the insulating film separating the floating gate from the channel region or well region cannot be reduced to about 7 nm or less) are contradictory, it is difficult to reduce the size. Actually, according to the ITRS (International Technology Roadmap for Semiconductors), there is no prospect of reduction in a physical gate length of about 0.2 micron or less. In the memory cell, since T1 and T2 can be individually designed as described above, size reduction is made possible.

For example, for a memory cell having a gate electrode length (word line width) of 45 nm, T2=4 nm and T1=7 nm are individually set, and a memory cell in which the short channel effect is not produced can be realized. The reason why the short channel effect is not produced even when T2 is set to be thicker than the thickness of a normal logic transistor is because the source/drain regions are offset from the gate electrode.

Since the source/drain regions are offset from the gate electrode in the memory cell, as compared with a normal logic transistor, reduction in size is further facilitated.

Since the electrode for assisting writing and erasing does not exist in the upper part of the memory functional unit, a high electric field acting between the electrode for assisting writing and erasing and the channel region or well region does not directly act on the insulating film separating the charge retaining film from the channel region or well region, but only a relatively low electric field which spreads in the horizontal direction from the gate electrode acts. Consequently, the memory cell having a gate length which is reduced to be equal to or less than the gate length of a logic transistor of the same process generation can be realized.

Ninth Embodiment

A ninth embodiment relates to a change in the electric characteristic at the time of rewriting a memory cell of a semiconductor memory device.

Figure 19:
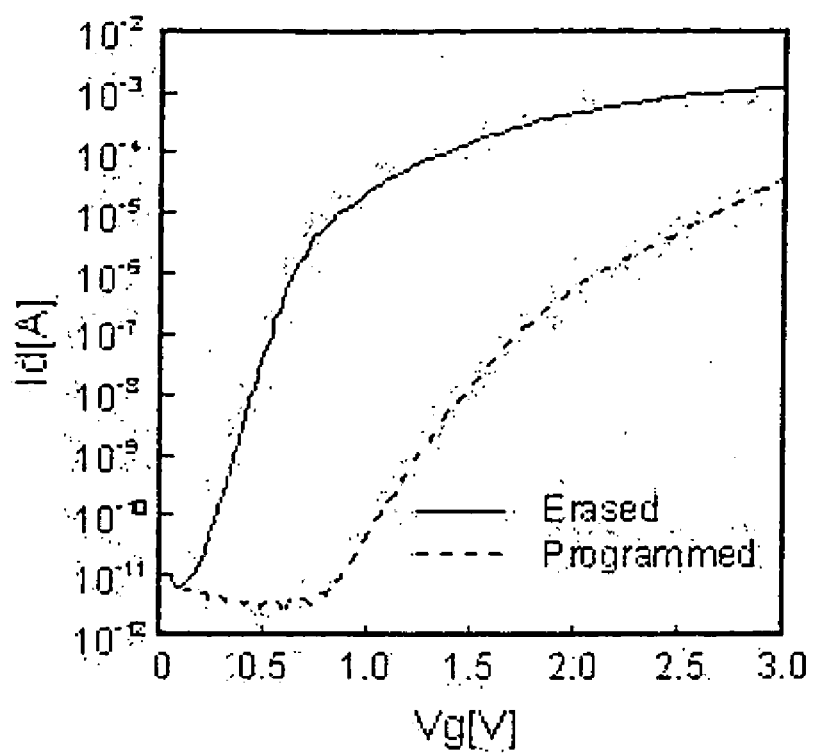
FIG. 19 is a schematic sectional view of a principal portion of a memory cell constituted a semiconductor memory device of the present invention (ninth embodiment)

In an N-channel type memory cell, when an amount of charges in a memory functional unit changes, a drain current (Id)-gate voltage (Vg) characteristic (actual measurement value) as shown in FIG. 19 is exhibited.

Figure 29:
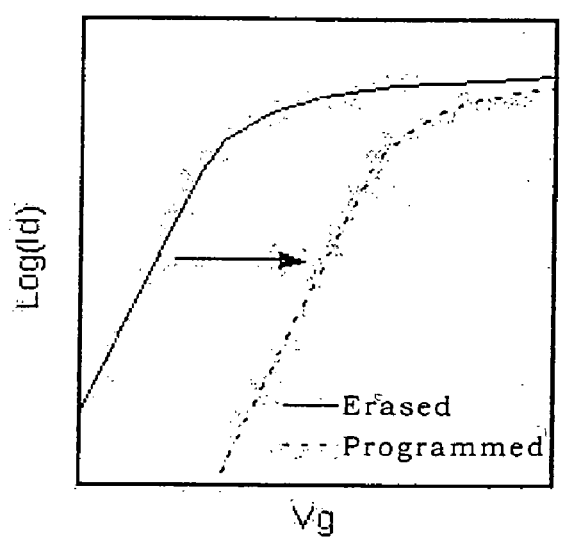
FIG. 29 is a diagram showing an electric characteristic of a conventional flash memory

As will be apparent from FIG. 19, in the case of performing a writing operation from an erasing state (solid line), not only the threshold simply increases, but also the gradient of a graph remarkably decreases in a sub-threshold region. Consequently, also in a region where a gate voltage (Vg) is relatively high, the drain current ratio between the erasing state and the writing state is high. For example, also at Vg=2.5V, the current ratio of two digits or more is maintained. The characteristic is largely different from that in the case of a flash memory (FIG. 29).

Appearance of such a characteristic is a peculiar phenomenon which occurs since the gate electrode and the diffusion region are offset from each other, and the gate electric field does not easily reach the offset region. When the memory cell is in a writing state, even when a positive voltage is applied to the gate electrode, an inversion layer is extremely hard to be formed in the offset region under the memory functional unit. This is the cause that the gradient of the Id-Vg curve is gentle in the sub-threshold region in the writing state.

On the other hand, when the memory cell is in an erasing state, electrons of high density are induced in the offset region. Further, when 0 V is applied to the gate electrode (that is, when the gate electrode is in an off state), electrons are not induced in the channel below the gate electrode (consequently, an off-state current is small). This is the cause that the gradient of the Id-Vg curve is sharp in the sub-threshold region in the erasing state, and current increasing rate (conductance) is high in the region of the threshold or more.

As will be understood from the above, in the memory cell in the semiconductor memory device of embodiments of the present invention, the drain current ratio between the writing operation and the erasing operation can be particularly made high.

Tenth Embodiment

A tenth embodiment relates to a semiconductor memory device in which a plurality of the memory cells of any of the first to eighth embodiments are arranged and to which rewriting and reading circuits are added, and relates to an operating method of the semiconductor memory device.

Figure 20:
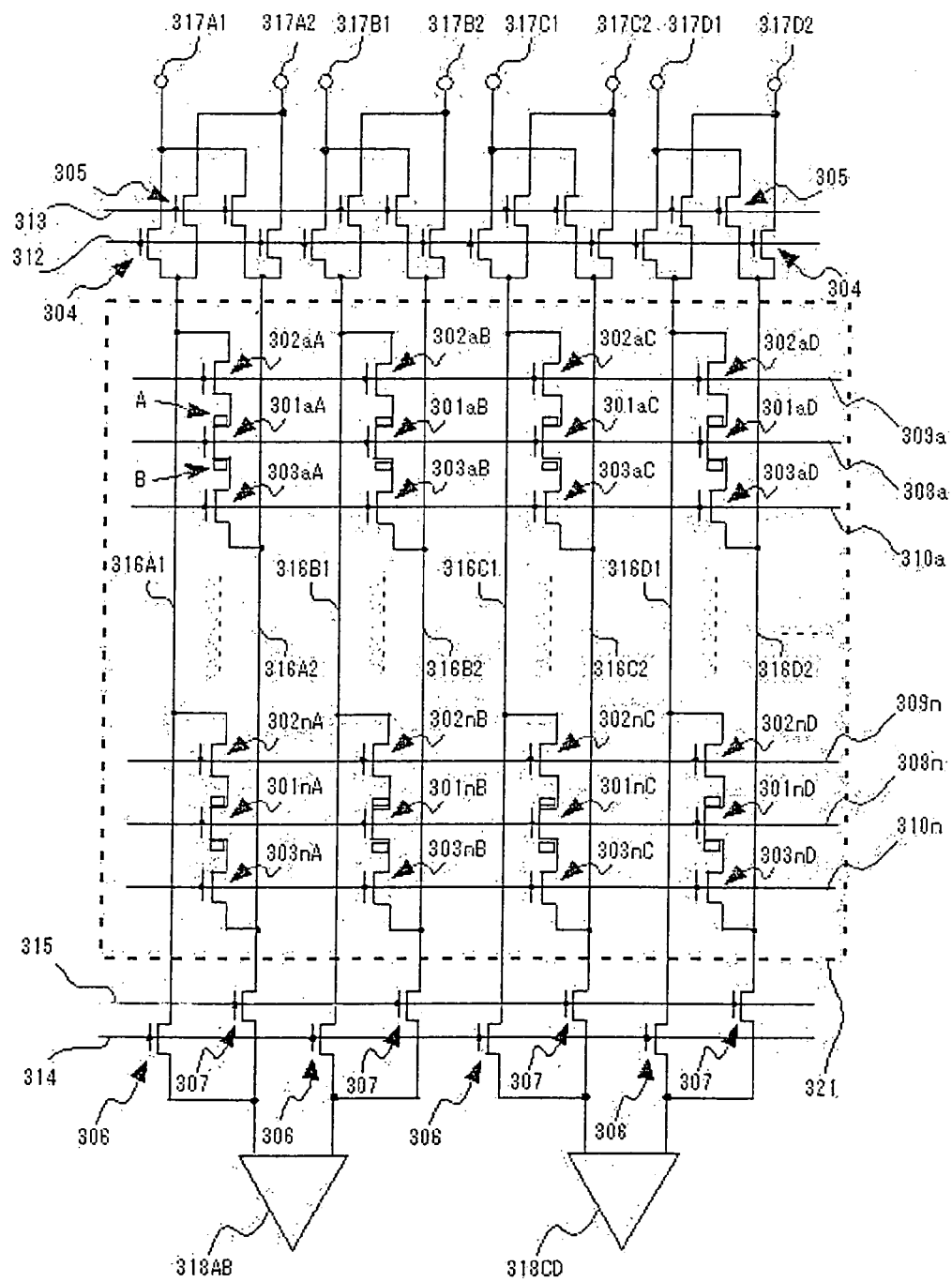
FIG. 20 is a circuit diagram of a semiconductor memory device of the present invention (tenth embodiment)
Figure 21A:
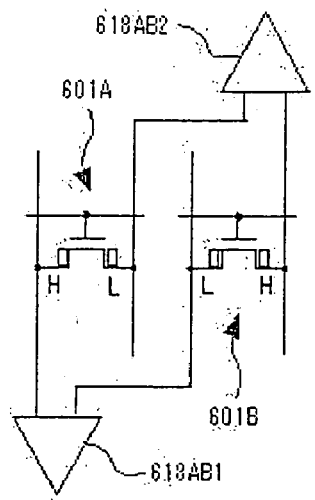
FIGS. 21A to 21D are conceptual diagrams showing 2-bit operation performed by two memory cells of semiconductor memory devices of the present invention (tenth embodiment)
Figure 21B:
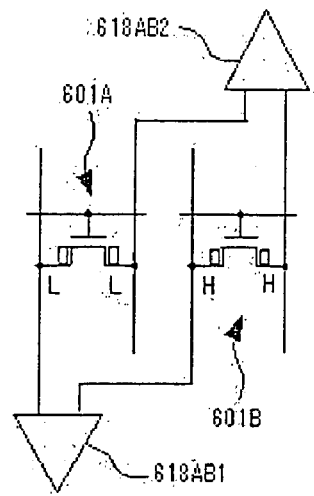
Figure 21C:
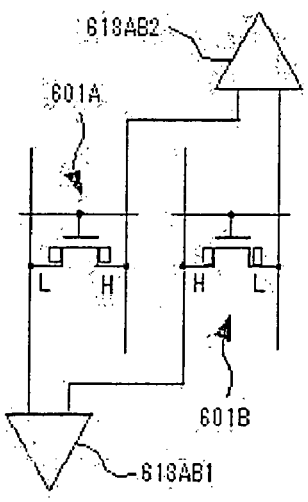
Figure 21D:
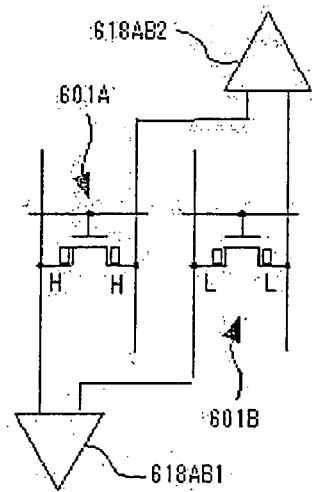

This semiconductor memory device includes: as shown in a circuit diagram of FIG. 20, a memory cell array region 321; a circuit part for applying a predetermined rewriting or reading voltage to each of the memory cells; a sense amplifier; and a circuit part for connecting the sense amplifier and the memory cells. The other peripheral circuits are not shown.

Memory cells 301aA to 301aD, . . . , and 301nA to 301nD in the region 321 in which memory cells are arranged denote memory cells described in any of the first to eighth embodiments. The memory cell has two memory functional units. In FIG. 20, arrows A and B are shown only for the memory cell 301aA, in order to discriminate the memory functional units from each other. The arrows are not shown for the other memory cells.

Two selection transistors are connected on both sides of each memory cell. For example, to the memory cell 301aA, selection transistors 302aA and 303aA are connected in series.

The gate electrodes of the memory cells 301aA to 301aD are connected to each other via a word line 308a. The gate electrodes of the other memory cells are also similarly connected to each other via a word line. Selection transistors 302aA to 302aD are connected to each other via a selection transistor word line 309a, and selection transistors 303aA to 303aD are connected to each other via a selection transistor word line 310a. The gate electrodes of other selection transistors are also similarly connected to each other via selection transistor word lines.

Each of the selection transistors 302aA to 302nA is connected to a first bit line 316A1, and each of selection transistors 303aA to 303nA is connected to a second bit line 316A2. Each of the other selection transistors is similarly connected to the first or second bit line.

To each bit line, a pair of operation selection transistors 304 and 305 is connected. The operation selection transistors 304 and 305 are connected to first voltage input terminals 317A1 to 317D1 or second voltage input terminals 317A2 to 317D2. The gate electrodes of the operation selection transistors 304 and 305 are connected to operation selection lines 312 and 313, respectively. With such wiring, in the case of selecting the operation selection line 312, for example, the first bit line 316A1 is connected to the first voltage input terminal 317A1, and the second bit line 316A2 is connected to the second voltage input terminal 317A2. In the case of selecting the operation selection line 313, for example, the first bit line 316A1 is connected to the second voltage input terminal 317A2, and the second bit line 316A2 is connected to the first voltage input terminal 317A1. That is, one pair of the bit lines 316A1 and 316A2 is connected to different voltage input terminals. By changing selection of an operation selection line, a voltage input terminal to be connected can be changed.

Two pairs of bit lines (for example, a pair of bit lines 316A1 and 316A2 and a pair of bit lines 316B1 and 316B2) are connected to one of input terminals and the other input terminal of a sense amplifier having two input terminals via switch transistors. More concretely, they are connected as follows.

The first bit lines 316A1 to 316D1 are connected to first switch transistors 306. The second bit lines 316A2 to 316D2 are connected to second switch transistors 307. The gate electrodes of the switch transistors 306 and 307 are connected to switch transistor selection lines 314 and 315, respectively. In such wiring, in the case where the switch transistor selection line 314 is selected, for example, one of input terminals of a sense amplifier 318AB is connected to the first bit line 316A1, and the other input terminal of the sense amplifier 318AB is connected to the first bit line 316B. In the case where the switch transistor selection line 315 is selected, for example, one of the input terminals of the sense amplifier 318AB is connected to the second bit line 316A2, and the other input terminal of the sense amplifier 318AB is connected to the first bit line 316B2.

As a sense amplifier, an amplifier capable of detecting output current from the memory cell may be used. For example, a differential amplifier can be used.

In FIG. 20, four pairs of bit lines are arranged. However, an arbitrary number of pairs of bit lines can be arranged. In FIG. 20, two pairs of bit lines are connected to one sense amplifier for the reason that, as will be described later, selected two memory cells are paired and connected to one of input terminals or the other input terminal of one sense amplifier.

In another example of application of the memory cell to such a semiconductor memory device, one memory cell is connected to one of input terminals of a sense amplifier, and an external reference cell is connected to the other input terminal of the sense amplifier.

A method of operating the semiconductor memory device will be described. The operations of the semiconductor memory device include a rewriting operation and a reading operation. Further, the rewriting operation includes a writing operation and a reading operation.

First, the method of writing operation will be described. As an example of the writing operation, the case of writing information to the memory cell 301aA will be described.

The operation selection line 312 is selected and the operation selection transistor 304 is set to an ON state. For example, the first bit line 316A1 is connected to the first voltage input terminal 317A1, and the second bit line 316A2 is connected to the second voltage input terminal 317A2. The other bit lines are connected similarly.

Further, the selection transistor word lines 309a and 310a are selected. One (on the side of the memory functional unit A) of diffusion regions (source and drain) of the memory cell 301aA is therefore connected to the first voltage input terminal 317A1, and the other region (on the side of the memory functional unit B) is connected to the second voltage input terminal 317A2. The memory cells 301aB to 301aD connected to the word line 308a are connected in a manner similar to the above.

To each of the word line 308a and the first and second voltage input terminals 317A1 and 317A2, predetermined voltage for writing is applied. First, for example, +5 V is applied to the word line 308a. Further, +5 V is applied to the first voltage input terminal 317A1 and 0 V is applied to the second voltage input terminal 317A2, thereby performing selective write to the side of the memory functional unit A of the memory cell 301aA.

When predetermined voltage is applied to the other voltage input terminals at this time, information can be written also to the memory cells 301aB to 301aD. For a memory cell to which information is not written, it is sufficient to apply 0 V to the voltage input terminal or set an open state.

In the case of writing information on the side of the memory functional unit B of the memory cell 301aA, it is sufficient to select the selection line 313 in place of selecting the operation selection line 312 and perform similar selecting operations under similar voltage applying conditions. It is also possible to interchange the voltage applied to the first voltage input terminal 317A1 and the voltage applied to the second voltage input terminal 317A2.

The method of the erasing operation will now be described. Herein, as an example of the erasing operation, the case of erasing information in the memory cell 301aA will be described.

In a manner similar to the writing operation, the operation selection line 312 is selected, the operation selection transistor 304 is set to an ON state, and the selection transistor word lines 309a and 310a are selected.

To each of the word line 308a and the first and second voltage input terminals 317A1 and 317A2, predetermined voltage for erasing is applied. First, for example, −5 V is applied to the word line 308a, +5 V is applied to the first voltage input terminal 317A1, and 0 V is applied to the second voltage input terminal 317A2, thereby performing selective erase on the side of the memory functional unit A of the memory cell 301aA.

When predetermined voltage is applied to the other voltage input terminals at this time, information in the memory cells 301aB to 301aD can be also erased. For a memory cell of which information is not erased, it is sufficient to apply 0 V to the voltage input terminal or set an open state.

In the case of erasing information on the side of the memory functional unit B of the memory cell 301aA, it is sufficient to select the selection line 313 in place of selecting the operation selection line 312 and perform similar selecting operations under similar voltage applying conditions. It is also possible to interchange the voltage applied to the first voltage input terminal 317A1 and the voltage applied to the second voltage input terminal 317A2.

The method of the reading operation will now be described. Herein, as an example of the reading operation, the case of reading information stored in the memory cell 301aA will be described.

In the case of reading stored information on the side of the memory functional unit A of the memory cell 301aA, the operation selection line 313 is selected to turn on the operation selection transistor 305, and the switch transistor selection line 314 is selected to turn on the first switch transistor 306. Further, voltage suitable for the reading operation, for example, +2 V is applied to the word line 308a. Subsequently, for example, +1.8 V is applied to the first voltage input terminal 317A1. The second voltage input terminal 317A2 is set to an open state.

According to the above-described selecting operation and the voltage applying conditions, current flows from the first voltage input terminal 317A1 to one of input terminals of the sense amplifier 318AB via the memory cell 301aA. By detecting the current value, information stored in the memory cell 301aA can be determined. In this instance, the memory functional unit A side of the memory cell 301aA serves as a source, so that the more or less of an amount of charges accumulated in the memory functional unit A mainly exerts an influence on the value of current flowing in the memory cell 301aA. Therefore, only information stored on the side of the memory functional unit A can be selectively read.

As described in the ninth embodiment, in the memory cell, the drain current ratio between the drain current at the time of writing and the drain current at the time of erasing can be made particularly high. Thus, it becomes easier to discriminate the writing state and the erasing state from each other.

In the case of reading information stored on the side of the memory functional unit B of the memory cell 301aA, the operation selection line 312 is selected in place of selecting the operation selection line 313, the switch transistor selection line 315 is selected in place of selecting the switch transistor selection line 314, and the other selecting operations and the voltage applying conditions are performed similarly above operations and conditions.

At the time of the reading operation, by applying a voltage for reading, for example, +1.8 V to the first voltage input terminal 317B1, current according to information stored in the memory cell 301aB is inputted to the other input terminal of the sense amplifier 318AB. Therefore, in the embodiment, the difference between current flowing in the memory cell 301aA and current flowing in the memory cell 301aB can be detected by the sense amplifier 318AB. In this case, 1-bit or 2-bit information is stored by two memory cells. As mentioned in the description of the reading operation, the directions of currents flowing in the memory cells are inverted and information stored in the memory functional units A and B is read independently at the time of reading operation, 2-bit operation can be performed by two memory cells. On the other hand, when each of the directions of currents flowing in the memory cells is limited to one direction at the time of reading operation, 1-bit operation is performed by two memory cells.

FIGS. 21A to 21D are conceptual diagrams showing 2-bit operation performed by two memory cells. In FIGS. 21A to 21D, for example, memory cells 601A and 601B and a sense amplifier 618AB1 (618AB2) correspond to the memory cells 301aA and 301aB and the sense amplifier 318AB in FIG. 20, respectively. Devices existing between the memory cells and the sense amplifier are not shown. Although two sense amplifiers 618AB1 and 618AB2 are shown in FIGS. 21A to 21D, like the semiconductor memory device of FIG. 20, connection between one sense amplifier and the memory cells may be switched using a switch transistor and an operation selection transistor.

FIGS. 21A to 21D show four possible states (two bits) of two memory cells. In any of the cases, currents corresponding to opposite information like "L and H" or "H and L" are inputted to two input terminals of the sense amplifier. By detecting the current difference, stored information can be read.

Figure 22A:
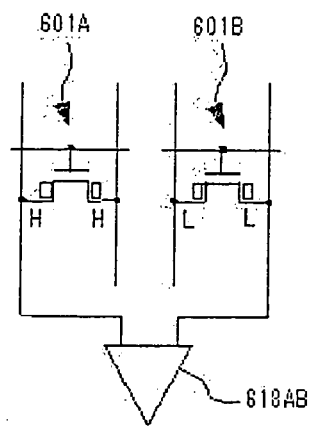
FIGS. 22A and 22B are conceptual diagrams showing 1-bit operation performed by two memory cells of semiconductor memory devices of the present invention (tenth embodiment)
Figure 22B:
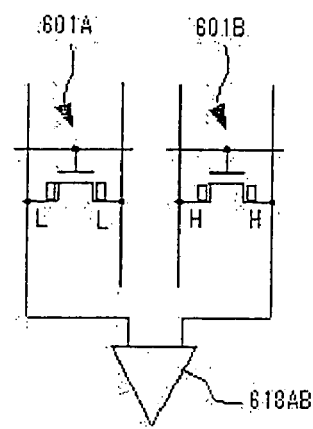

FIGS. 22A and 22B show conceptual diagrams of 1-bit operation performed by two memory cells. In this case, the direction of current flowing in the memory cells is not inverted at the time of the reading operation, so that only one sense amplifier 618AB is wrote. FIGS. 22A and 22B show two possible states (one bit) of two memory cells. In any of the cases, currents corresponding to opposite information like "L and H" or "H and L" are inputted to two input terminals of the sense amplifier. Preferably, as shown in FIGS. 22A and 22B, the same information is stored in two memory functional units of each memory cell. By the arrangement, the reliability of the reading operation can be improved.

2-bit information can be stored in one memory cell by employing a configuration in which one memory cell is connected to one of input terminals of the sense amplifier and an external reference cell is connected to the other input terminal of the sense amplifier.

Like the embodiment, however, it is preferable that outputs of two memory cells (paired memory cells) are inputted to the same sense amplifier. In the case of such a configuration, information stored in the memory cells can be read, by detecting the difference between currents flowing in the two memory cells having the same device structure. On the other hand, for example, in the case of using a transistor having a normal structure as an external reference, the difference between the temperature characteristic of the memory cell and that of the transistor having the normal structure becomes a cause of deteriorating the reliability of the reading operation. Therefore, the reliability of the reading operation can be improved by inputting outputs of the paired memory cells to the same sense amplifier.

In the semiconductor memory device of the embodiment, two selection transistors are connected respectively one to each side of each memory cell. Therefore, at the time of the rewriting operation, rewrite voltage applied to a bit line is applied only to the single memory cell selected but is not applied to the other memory cells connected to the same bit line pair. Therefore, erroneous rewriting of a not-selected cell can be prevented in the rewriting operation.

At the time of the reading operation, a problem such that an off-state current of a not-selected cell is added to a read current of a selected cell, and a margin of the reading operation is reduced. This effect is particularly conspicuous when the number of word lines is large and the number of cells connected to the same bit line pair is large.

Also in the case where one selection transistor is provided only one of sides of each memory cell, the off-state current of a not-selected cell can be reduced in the reading operation.

The word lines 308a to 308n can be formed by, for example, connecting the gate electrodes of memory cells by using an upper metal wire. However, it is preferable that the gate electrodes of memory cells (at least paired memory cells) integrally function as a word line, and the paired memory cells shares the memory functional units at both sides of the gate electrodes. For example, when a linear polysilicon electrode extends on active regions of a plurality of semiconductor layers and an active region of the polysilicon electrode and that of the semiconductor layer are separated by a gate insulating film, the polysilicon serves as the function of the gate electrode on each active region, and the linear polysilicon electrode itself has the function of a word line. In this case, the contact for connecting the gate electrode and the upper metal wire can be largely reduced, and the integration of the semiconductor memory device can be increased. Since the gate electrodes share the memory functional unit, it is unnecessary to isolate the memory functional unit for each memory cell. Thus, the manufacturing process can be simplified, and a cheap, very reliable semiconductor memory device can be obtained.

Preferably, in the semiconductor memory device of the embodiment, a logic transistor is also mounted on the same semiconductor chip.

Figure 25:
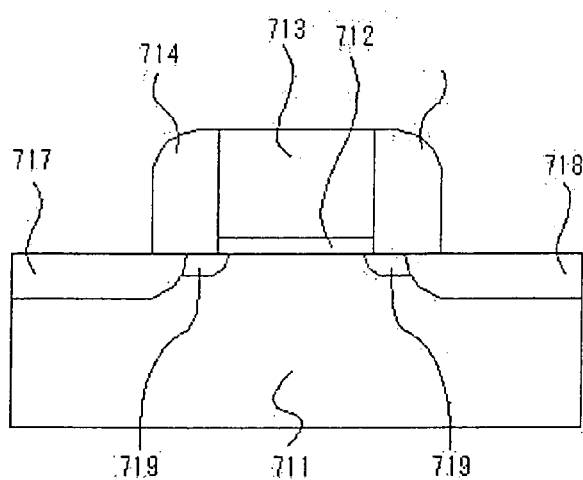
FIG. 25 is a schematic sectional view of a principal portion of a standard transistor.

Since the procedure for forming the memory cell of the embodiment is highly compatible with a normal standard transistor forming process, a process for mounting the semiconductor memory device, that is, the memory cell and the logic transistor is very simple. In a standard transistor as a component of a logic circuit part or an analog circuit part, as shown in FIG. 25, usually, a gate electrode 713 having sidewall spacers 714 made of an insulating film on its sidewalls is formed on a semiconductor substrate 711 via a gate insulating film 712, and a source region 717 and a drain region 718 are formed on both sides of the gate electrode 713. Each of the source region 717 and the drain region 718 has an LDD (Lightly Doped Drain) region 719. Therefore, the configuration of the standard transistor is similar to that of a memory cell in the semiconductor memory device. In order to change the standard transistor to the memory cell, for example, it is sufficient to add the function of the memory functional unit to the sidewall spacer 714 and not to form the LDD region 719.

More concretely, it is sufficient to change the sidewall spacer 714 to have a structure similar to, for example, that of each of the memory functional units 261 and 262 in FIG. 8. In this case, the film thickness configuration ratio of the silicon oxide films 241 and 243 and the silicon nitride film 242 can be appropriately adjusted so that the memory cell operates suitably. Even when the sidewall spacers of a transistor constructing a standard logic part have a structure similar to, for example, that of the memory functional units 261 and 262 of FIG. 8, as long as the width of the sidewall spacer (that is, the total thickness of the silicon oxide films 241 and 243 and the silicon nitride film 242) is suitable and operation is performed within a voltage range in which rewriting operation does not start, the transistor performances are not deteriorated.

It is sufficient to inject impurity for forming the LDD region after formation of a gate electrode and before formation of the memory functional unit (sidewall spacer), in order to form the LDD region in the transistor as a component of the standard logic part. Therefore, at the time of injecting impurity for forming the LDD region, only by masking the memory cell with a photoresist, the memory cell and the standard transistor can be formed simultaneously and easily.

The forming process of a flash memory according to the prior art is largely different from the standard logic process. Therefore, as compared with the conventional case where the flash memory is used as a nonvolatile memory and formed together with a logic circuit and an analog circuit, in the semiconductor memory device of embodiments of the present invention, the number of masks and the number of processes can be dramatically reduced. Consequently, the yield of a chip on which a nonvolatile memory cell is formed together with a logic circuit and an analog circuit improves, the manufacturing cost is reduced, and a cheap, very-reliable semiconductor memory device can be obtained.

In the semiconductor memory device of the embodiment, preferably, values different from each other are stored in two memory cells connected to one sense amplifier and, at the time of reading, the difference between values of currents flowing in the two memory cells is detected by the sense amplifier. In the case where values different from each other are stored in two memory cells connected to one sense amplifier, the reliability of reading is higher than that in the case where one memory cell and an external reference cell are connected to one sense amplifier. The reading speed can be improved and a reading current value can be decreased. The reason why the reliability of reading increases when values different from each other are stored in two memory cells connected to one sense amplifier is as follows. Since the numbers of rewriting times of the two memory cells can be made coincide with each other, even in the case where a characteristic change occurs in association with device deterioration, the characteristic changes in the two memory cells are almost the same, and the difference between the values of currents flowing in the two memory cells is not easily changed. For a similar reason, the difference between the values of currents flowing in the two memory cells can maintained so as to be large, so that the reading speed can be improved. For a similar reason, it is easy to make the sensitivity of the sense amplifier high and decrease the read current value. If the read current value can be reduced, the gate width of the memory cell can be decreased, and the integration of a memory cell array can be increased.

The operation method of storing values different from each other into two memory cells connected to one sense amplifier and, at the time of reading, detecting the difference between values of currents flowing in the two memory cells by the sense amplifier is particularly preferable in the case of using the semiconductor memory device of an embodiment of the present invention.

As described in the ninth embodiment, the ratio between the drain current in the writing operation and the drain current in the erasing operation can be made high. Consequently, the difference of values of currents flowing in the two memory cells can be made large, and high-speed reading can be realized. Alternatively, even when the gate width of the memory cell is reduced, the required difference of current values can be obtained. Consequently, by reducing the gate width of the memory cell, it is particularly easy to increase the integration of the memory cell array.

In two memory cells connected to one sense amplifier, one (A) of the memory functional units and the other memory functional unit (B) may be independently rewritten (the operating method shown in FIGS. 21A to 21D). In this case as well, it is preferable to store values different from each other in the memory functional unit (A) and the values different from each other in the other memory functional unit (B). By the two memory cells, 2-bit information can be stored. It is necessary to preliminarily form a configuration in which the direction of current flowing in the memory cells can be inverted at the time of reading operation.

Alternately, the two memory cells connected to one sense amplifier may operate so that the storing states of the memory functional units (A) and (B) become the same (the operating method shown in FIGS. 22A and 22B). In this case, 1-bit information can be stored by two memory cells. The reliability of the reading operation can be further increased by making the storing states of memory functional units on both sides the same.

Specifically, in the reading operation, the drain current sensitively reacts with the charge amount of the memory functional unit on the source side but is not so sensitive to the charge amount of the memory functional unit on the drain side. Nevertheless, the drain current of the memory cell is influenced by the charge amount of the memory functional unit on the drain side. The influence produces an interference effect, the value of current supplied to the sense amplifier fluctuates, and the margin of the read current increases. Therefore, the fluctuation in the value of current supplied to the sense amplifier is reduced, and the reliability of the reading operation can be further increased, by performing operation so that the storing states of the memory functional units (A) and (B) become the same in the two memory cells connected to one sense amplifier.

As the memory cell used in the embodiment, it is preferable to use the memory cell of the seventh embodiment. Specifically, the thickness (T1) of the insulating film separating the charge retaining film (silicon nitride film 242) from the channel region or well region is preferably smaller than the thickness (T2) of the gate insulating film and is 0.8 nm or more. The voltage of the writing operation and erasing operation can be decreased or the writing operation and erasing operation can be performed at higher speed by using such a memory cell to the semiconductor memory device of the embodiment. Since the memory effect of the memory cell increases, high reading speed of the semiconductor memory device can be realized.

As the memory cell used for the embodiment, it is preferable to use the memory cell of the eighth embodiment. Specifically, the thickness (T1) of the insulating film separating the charge retaining film (silicon nitride film 242) from the channel region or well region is preferably thicker than the thickness (T2) of the gate insulating film and 20 nm or less. Without deteriorating the short channel effect of the memory cell, the retention characteristic can be improved by using such a memory cell for the semiconductor memory device of the embodiment. Even when the integration of the semiconductor memory device is increased, sufficient storing and retaining performances can be obtained.

In the memory cell used in the embodiment, as described in the second embodiment, preferably, the region for retaining charges (silicon nitride film 242) in the memory functional units 261 and 262 overlaps with the diffusion regions 212 and 213. Sufficiently high reading speed of the semiconductor memory device can be achieved by using such a memory cell for the semiconductor memory device of the embodiment.

In the memory cell used in the embodiment, as described in the second embodiment, the memory functional unit preferably includes a charge retaining film disposed substantially parallel to the surface of the gate insulating film. When such a memory cell is used for the semiconductor memory device of the embodiment, variations in the memory effect of the memory cell can be reduced, so that read current variations in the semiconductor memory device can be suppressed. Further, the characteristic change in the memory cell which is retaining information can be suppressed, so that the storage and retention characteristics of the semiconductor memory device can be improved.

In the memory cell used for the embodiment, as described in the third embodiment, it is preferable that the memory functional unit include a charge retaining film disposed substantially parallel with the surface of the gate insulating film and also include a part extending in almost parallel with the side face of the gate electrode. When such a memory cell is used for the semiconductor memory device of the embodiment, the rewriting speed of the memory cell increases, so that the rewriting operation of the semiconductor memory device can be performed at higher speed.

As the memory cell used in the embodiment, it is most preferable to use the above-described memory cell in the best mode. By the memory cell, the best performances of the semiconductor memory device can be obtained.

Eleventh Embodiment

A semiconductor memory device of an eleventh embodiment is similar to the semiconductor memory device of the tenth embodiment except that the selection transistor is not disposed.

Figure 23:
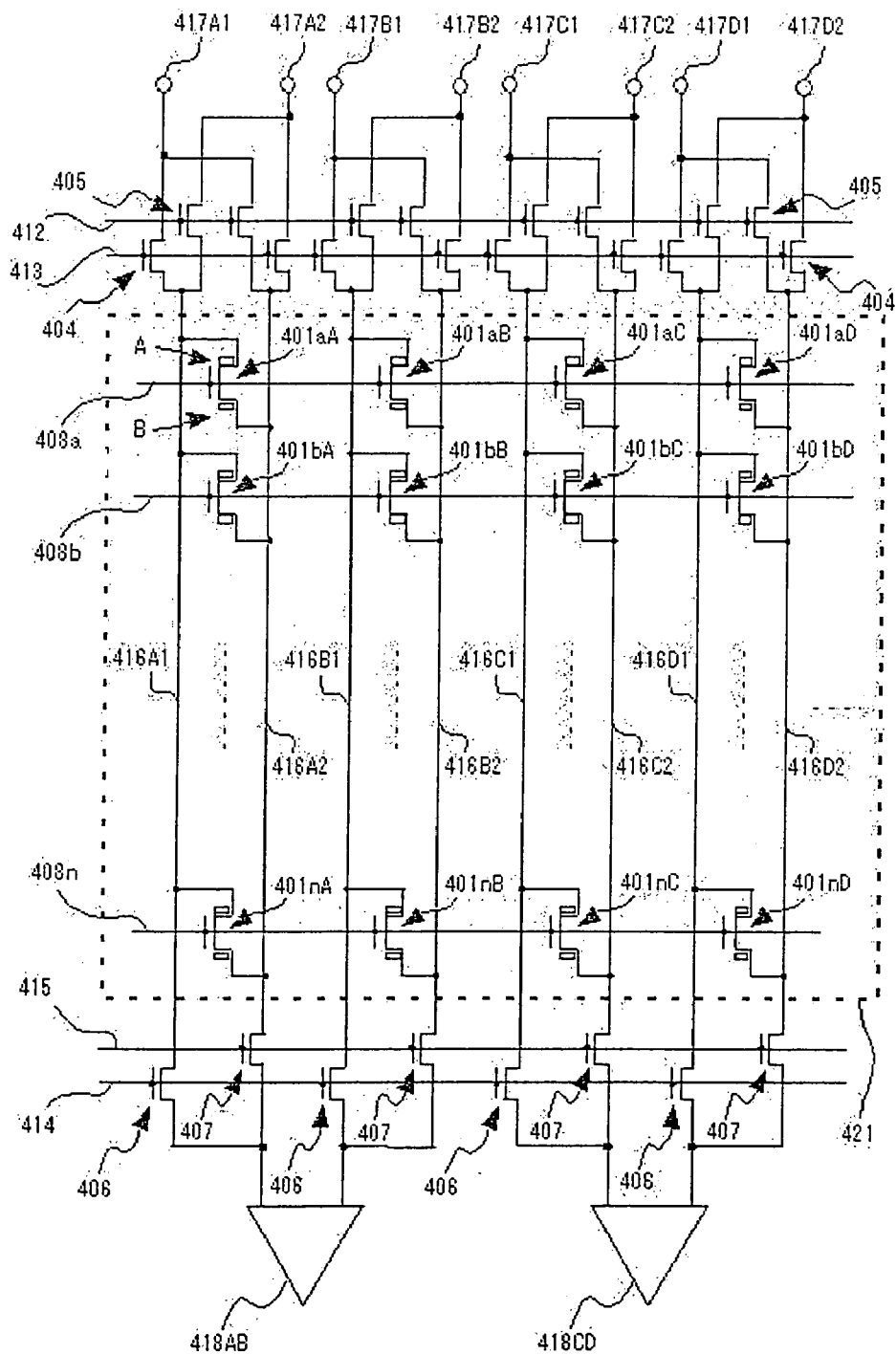
FIGS. 23 and 24 are circuit diagrams of semiconductor memory devices of the present invention (eleventh and twelfth embodiment)

FIG. 23 is a circuit diagram of the semiconductor memory device, which is different from FIG. 20 only with respect to a memory cell array region 421. Operation selection transistors 404 and 405, operation selection lines 412 and 413, first voltage input terminals 417A1 to 417D1, second voltage input terminals 417A2 to 417D4, a first switch transistor 406, a second switch transistor 407, switch transistor selection lines 414 and 415, sense amplifiers 418AB and 418CD, and word lines 408a to 408n are similar to those of the semiconductor memory device (FIG. 20) of the tenth embodiment.

Memory cells 401aA to 401aD, ..., and 401nA to 401nD are directly connected to first bit lines 416A1 to 416D1 and second bit lines 416A2 to 416D2, respectively.

The operating methods are similar to those of the semiconductor memory device (FIG. 20) of the tenth embodiment. However, since there is no selection transistor, at the time of rewriting, rewrite voltage is applied to the sources and drains of all of memory cells connected to the same bit line pair. It is therefore necessary to design the memory cells so that memory cells connected to word lines other than the selected word line are not rewritten.

In the semiconductor memory device of the embodiment, since there is no selection transistor, the integration can be largely increased. Therefore, the manufacturing cost is largely reduced, and a cheap semiconductor memory device can be obtained.

In the memory cell of embodiments of the present invention, over-erasure which is the problem of the EEPROM does not occur. Consequently, it is particularly preferable to use the memory cell of embodiments of the present invention for a semiconductor memory device having a plurality of word lines and having no selection transistor like this embodiment for the following reason. In the case where the threshold becomes negative due to over-erasure in one of the memory cells (for example, the memory cell 401$a$A), the first bit line 416A1 and the second bit line 416A2 are always in a conductive state. A memory cell connected between the bit lines cannot be selected.

Twelfth Embodiment

A semiconductor memory device of a twelfth embodiment is obtained by further increasing the integration of a memory cell array region 521.

Figure 24:
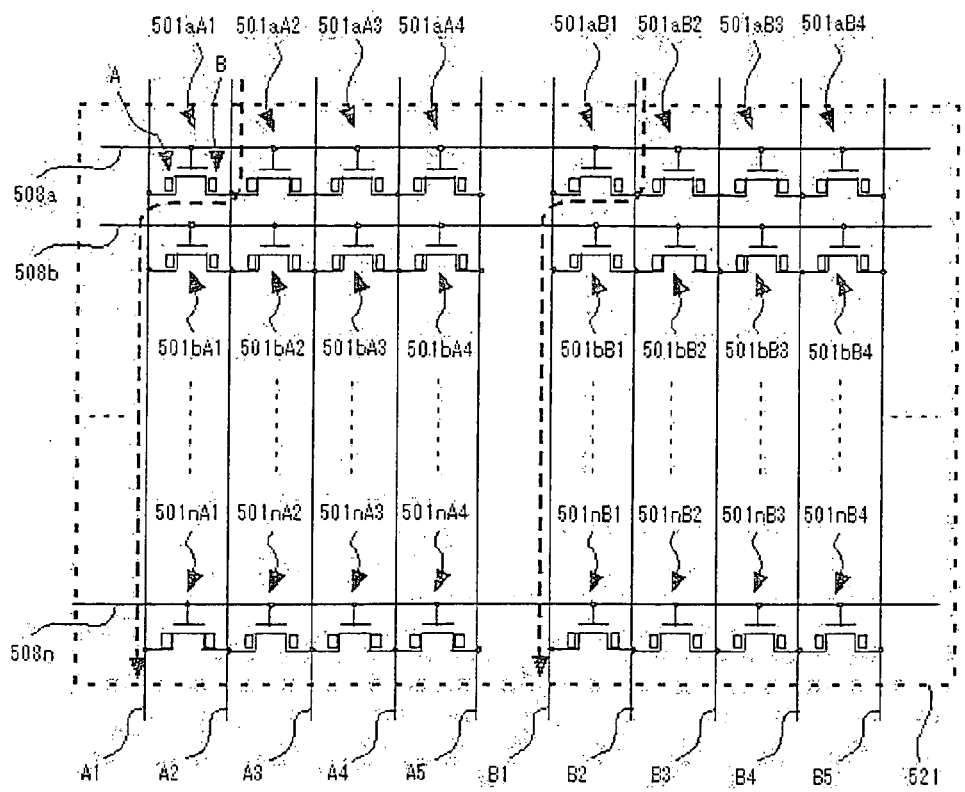

In FIG. 24, reference characters 501$a$A1 to 501$a$A4, 501$a$B1 to 501$a$B4, . . . , and 501$n$B1 to 501$n$B4 denote memory cells, reference characters 508$a$ to 508$n$ denote word lines, and reference characters BA 1 to BA5 and BB1 to BB5 denote bit lines. The portion in which the memory cells are arranged in the semiconductor memory device is different from that of each of the tenth and eleventh embodiments is with respect to the point that each of the bit lines is shared by memory cells belonging to neighboring columns. Concretely, the bit lines A2 to A4 and the bit lines B2 to B4 are shared. Although memory cells in four columns construct one block in the embodiment, the present invention is not limited to the number of columns.

In the semiconductor memory device, reading operation is performed by supplying currents flowing in two memory cells, for example, the memory cells 501$a$A1 and 501$b$B1 belonging to different blocks to one of input terminals and the other input terminals of a sense amplifier and detecting the difference between the current values. In this case, for example, one of the input terminals of the sense amplifier and the bit line A1 are connected to each other, and the other input terminal and the bit line B1 are connected to each other. Further, voltage which is suitable for reading operation (for example, +1.8 V) is applied to the bit lines A2 and B2. Broken lines in FIG. 24 show paths of currents flowed at this time. The currents flowing in the paths are supplied to the two input terminals of the sense amplifier and the difference between the currents is detected. In FIG. 24, circuits for connecting memory cells, voltage input terminals and sense amplifiers are not shown.

In the semiconductor memory device of the embodiment, the bit lines are shared by memory cells belonging to the neighboring columns, so that the integration can be largely increased. Therefore, the manufacturing cost is largely reduced, and a cheap semiconductor memory device can be obtained.

Thirteenth Embodiment

Figure 26:
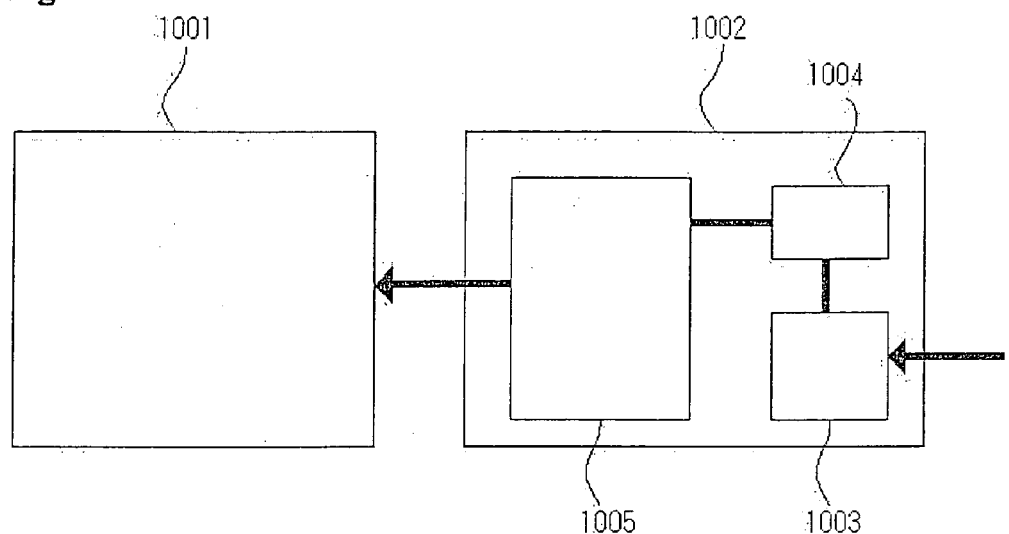
FIG. 26 is a schematic block diagram of a liquid crystal device assembled a semiconductor memory device of the present invention (thirteenth embodiment)

As an application example of the semiconductor memory device, for example, as shown in FIG. 26, a rewritable nonvolatile memory for image adjustment of a liquid crystal panel can be mentioned.

A liquid crystal panel 1001 is driven by a liquid crystal driver 1002. In the liquid crystal driver 1002, a nonvolatile memory 1003, an SRAM 1004 and a liquid crystal driver circuit 1005 are provided. The nonvolatile memory 1003 is constructed by the memory cell of an embodiment of the present invention, more preferably, any of the semiconductor memory devices of the tenth to thirteenth embodiments. The nonvolatile memory 1003 can be rewritten from the outside.

Information stored in the nonvolatile memory 1003 is transferred to the SRAM 1004 at the time of turn-on of the power source of an apparatus. The liquid crystal driver circuit 1005 can read stored information from the SRAM 1004 as necessary. By providing the SRAM, high reading speed of stored information can be achieved.

The liquid crystal driver 1002 may be externally attached to the liquid crystal panel 1001 as shown in FIG. 26 or formed on the liquid crystal panel 1001.

In a liquid crystal panel, tones displayed by applying voltages in multiple grades to pixels are changed. The relation between the given voltage and the displayed tone varies according to products. Consequently, information for correcting variations in each product after completion of the product is stored and correction is made on the basis of the information, thereby enabling the picture qualities of products to be made uniform. It is therefore preferable to mound a rewritable nonvolatile memory for storing correction information. As the nonvolatile memory, it is preferable to use the memory cell of an embodiment of the present invention. Particularly, it is preferable to use any of the semiconductor memory devices of the tenth to thirteenth embodiments in which memory cells of the present invention are integrated.

A process for forming the memory cell together with a liquid crystal driver and the like is easy, by using the memory cell of an embodiment of the present invention as the nonvolatile memory for image adjustment of the liquid crystal panel, so that the manufacturing cost can be reduced. The memory scale of any of the semiconductor memory devices of the tenth to thirteenth embodiments is relatively small and is particularly suitable in the case where reliability or stability is important. Since outputs of two memory cells (paired memory cells) are inputted to the same sense amplifier and the difference between currents flowing in the two memory cells having similar device structures is detected, the reading operation can be performed stably and reliably. Consequently, an area per bit increases. However, when the memory scale is small, as compared with the other circuit area, the increasing ratio is permissible. Usually, a nonvolatile memory for image adjustment of a liquid crystal panel has a capacity of, for example, a few kilobytes, and its memory scale is relatively small. Therefore, it is particularly preferable to use any of the semiconductor memory devices of the tenth to thirteenth embodiments as the nonvolatile memory for image adjustment of the liquid crystal panel.

Fourteenth Embodiment

Figure 27:
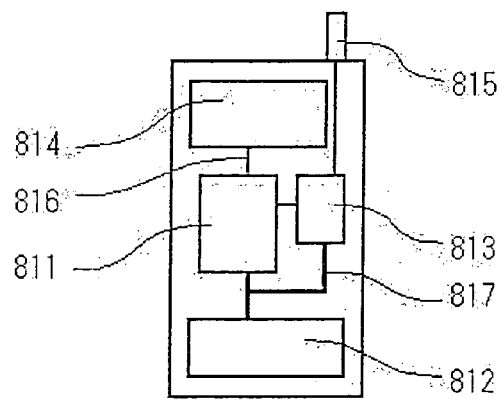
FIG. 27 is a schematic block diagram of a portable electronic apparatus assembled a semiconductor memory device of the present invention (fourteenth embodiment)
Figure 28:
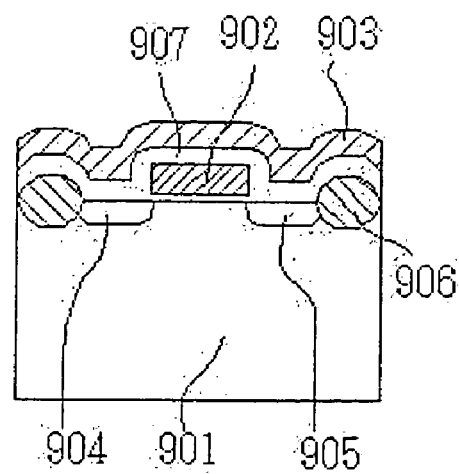
FIG. 28 is a schematic sectional view of a principal portion of a conventional flash memory.

FIG. 27 shows a portable telephone as a portable electronic apparatus in which the semiconductor memory device is assembled.

The portable telephone is constructed mainly by a control circuit 811, a battery 812, an RF (radio frequency) circuit 813, a display 814, an antenna 815, a signal line 816, a power source line 817 and the like. In the control circuit 811, the semiconductor memory device of an embodiment of the present invention is assembled. The control circuit 811 is preferably an integrated circuit using cells having the same structure as a memory circuit cell and a logic circuit cell as described in the tenth embodiment. It facilitates fabrication of the integrated circuit, and the manufacturing cost of the portable electronic apparatus can be particularly reduced.

The operation speed of the portable electronic apparatus is increased, and the manufacturing cost can be reduced, by using the semiconductor memory device capable of performing high-speed reading operation and whose process of mounting a memory part and a logic circuit part simultaneously is easy for a portable electronic apparatus. Thus, a cheap, high-reliability, and high-performance portable electronic apparatus can be obtained.

Since the semiconductor memory device of embodiments of the present invention is constructed so that an output of a memory cell is inputted to an amplifier, information stored in the memory cell can be read.

Since the memory cell has separately the memory function of the memory functional unit and the transistor operation function of the gate insulating film, without deteriorating the memory function, the gate insulating film can be thinned and the short channel effect can be suppressed.

Further, the value of current flowing between the diffusion regions changes by rewriting more largely as compared with an EEPROM. Therefore, the writing state and the erasing state of the semiconductor memory device can be easily discriminated from each other, so that the reliability can be improved.

Moreover, the memory cell forming process is highly compatible with the normal transistor forming process. Thus, as compared with the case of constructing the semiconductor memory device by forming the conventional flash memory as a nonvolatile memory cell together with an amplifier as a normal transistor, the number of masks and the number of processes can be dramatically reduced. Therefore, the yield of the chip on which the amplifier and the nonvolatile memory cell are simultaneously mounted is improved, the cost is reduced, and the cheap, very reliable semiconductor memory device can be obtained.

In the semiconductor memory device, in addition to the above-described effects, outputs of the paired memory cells are inputted to the same amplifier, so that the difference between currents flowing in the two memory cells having the same device structure can be detected. Therefore, the reliability of reading operation can be improved.

In the case where the gate electrodes of the paired memory cells integrally function as a word line, and the paired memory cells integrally share the memory functional units at both sides of the gate electrodes, wiring for connecting the gate electrodes can be simplified, the integration of the semiconductor memory device can be increased, it is unnecessary to separate the memory functional units for every memory cell, and the fabricating process can be simplified.

When the memory cell can be rewritten in first and second storing states of different amounts of charges accumulated in memory functional units and, at the time of reading, one of the paired memory cells is in the first storing state, and the other memory cell is allowed to operate in the second storing state, information different from each other is stored in two memory cells connected to one amplifier. Consequently, as compared with the case of connecting one memory cell and an external reference cell to one operation amplifier, the reliability of reading is higher. The reading speed can be improved, and the reading current value can be decreased.

In the memory cell, when each of two memory functional units formed on both sides of a gate electrode can be rewritten in first and second storing states of different amounts of charges accumulated in the memory functional units, at the time of reading, the storing states of the two memory functional units belonging to the same memory cell are the same and informations stored in memory functional units belonging to one and other of the paired memory cells are different from each other, at the time of reading, the storing states of one of the memory functional unit and the other memory functional unit of the two memory cells connected to one amplifier are the same, so that the reliability of reading operation can be increased more.

In the case where a plurality of paired memory cell are connected to the same amplifier, the paired memory cell are connected to different word lines, and an output of a predetermined paired memory cell is inputted to the amplifier by selection of one word line, the integration of the semiconductor memory device can be increased more.

In the case where one or more transistors are connected in series to the memory cell, the problem such that at the time of reading, an off state current of a not-selected memory cell is added to read current of a selected memory cell, and the margin of the reading operation is reduced.

In the case where the memory functional unit is formed so that at least a part of it overlaps with a part of the diffusion region, sufficiently high reading speed of the semiconductor memory device can be achieved.

In the case where the memory functional unit includes a film having the function of retaining charges and whose surface is substantially parallel with the surface of a gate insulating film, variations in the memory effect of the memory cell can be reduced, and variations in read currents of the semiconductor memory device can be suppressed. Since the characteristic change of the memory cell which is storing and retaining information can be reduced, the storage and retention characteristic of the semiconductor memory device can be improved.

In the case where the film having the function of retaining charges is disposed substantially parallel with the side face of the gate electrode, the rewriting speed of the memory cell increases. Thus, the rewriting operation of the semiconductor memory device can be increased.

When the memory functional unit has an insulating film for separating a film having the function of retaining charges from a channel region or semiconductor layer, and the insulating film is thinner than a gate insulating film and has a thickness of 0.8 nm or more, the voltage of writing operation and erasing operation of the semiconductor memory device can be decreased, or the writing and erasing operations can be performed at higher speed. Since the memory effect of the memory cell increases, high reading speed of the semiconductor memory device can be achieved.

In the case where the memory functional unit has an insulating film separating the film having the function of retaining charges from the channel region or semiconductor layer and the insulating film is thicker than the gate insulating film and has a thickness of 20 nm or less, without deteriorating the short channel effect of the memory cell, the retention characteristic can be improved. Consequently, even when the integration of the semiconductor memory device is increased, sufficient storage and retention characteristics can be obtained.

Since a display device of an embodiment of the present invention has the semiconductor memory device, for example, the nonvolatile memory cell can be used to store information for correcting variations in display after a display panel is manufactured, thereby enabling the picture qualities of products of display devices to be made uniform. Moreover, the process for forming both a memory cell and a logic circuit part is easy, so that the manufacturing cost can be suppressed. Thus, a cheap and reliable display device can be obtained.

Since an electronic apparatus of an embodiment of the present invention, particularly, a portable electronic apparatus has the semiconductor memory device, the process for forming both a memory part and a logic circuit part is easy, the operation speed of the electronic apparatus can be improved, the manufacturing cost can be reduced, and the cheap and reliable display device can be obtained.

What is claimed is:

1. A semiconductor memory device including: an amplifier; and first and second paired memory cells each having a gate electrode formed on a semiconductor layer via a gate insulating film, a channel region disposed below the gate electrode, a diffusion region disposed on both sides of the channel region and having a conductive type opposite to that of the channel region, and memory functional units formed on both sides of the gate electrode and having a function of retaining charges and being an insulator containing a silicon nitride film; wherein outputs of the paired memory cells are inputted to the amplifier.

2. The semiconductor memory device according to claim 1, wherein the memory cell is rewritable in first and second storing states of different amounts of charges accumulated in the memory functional units and, at the time of reading, one of the paired memory cells is in the first storing state, and the other memory cell is allowed to operate in the second storing state.

3. The semiconductor memory device according to claim 1, wherein one or more transistors are connected in series to the memory cell.

4. The semiconductor memory device according to claim 1, wherein the memory functional unit is formed so that at least a part of the memory functional unit overlaps with a part of the diffusion region.

5. The semiconductor memory device according to claim 1, wherein the memory functional unit includes a film having the function of retaining charges and whose surface is substantially parallel with the surface of a gate insulating film.

6. The semiconductor memory device according to claim 5, wherein the memory functional unit has an insulating film separating the film having the function of retaining charges from the channel region or semiconductor layer and the insulating film is thicker than the gate insulating film and has a thickness of 20 nm or less.

7. A display device in which the semiconductor memory device according to claim 1 is incorporated.

8. A portable electronic apparatus in which the semiconductor memory device according to claim 1 is incorporated.

9. A semiconductor memory device including:
an amplifier; and first and second paired memory cells each having a gate electrode formed on a semiconductor layer via a gate insulating film, a channel region disposed below the gate electrode, a diffusion region disposed on both sides of the channel region and having a conductive type opposite to that of the channel region, and memory functional units formed on both sides of the gate electrode and having a function of retaining charges; wherein outputs of the paired memory cells are inputted to the amplifier, and wherein the gate electrodes of the paired memory cells integrally function as a word line, and the paired memory cells integrally share the memory functional units at both sides of the gate electrodes.

10. A semiconductor memory device including:
an amplifier; and first and second paired memory cells each having a gate electrode formed on a semiconductor layer via a gate insulating film, a channel region disposed below the gate electrode, a diffusion region disposed on both sides of the channel region and having a conductive type opposite to that of the channel region, and memory functional units formed on both sides of the gate electrode and having a function of retaining charges; wherein outputs of the paired memory cells are inputted to the amplifier, wherein the memory cell is rewritable in first and second storing states of different amounts of charges accumulated in each of two memory functional units formed on both sides of a gate electrode, and wherein at the time of reading, the storing states of the two memory functional units belonging to the same memory cell are the same and information stored in memory functional units belonging to one of the paired memory cells is different from information stored in memory functional units belonging to the other of the paired memory cells.

11. A semiconductor memory device including:
an amplifier; and first and second paired memory cells each having a gate electrode formed on a semiconductor layer via a gate insulating film, a channel region disposed below the gate electrode, a diffusion region disposed on both sides of the channel region and having a conductive type opposite to that of the channel region, and memory functional units formed on both sides of the gate electrode and having a function of retaining charges; wherein outputs of the paired memory cells are inputted to the amplifier, and wherein a plurality of paired memory cell are connected to the amplifier, the paired memory cell are connected to different word lines, and an output of a predetermined paired memory cell is inputted to the amplifier by selection of one word line.

12. A semiconductor memory device including:
an amplifier; and first and second paired memory cells each having a gate electrode formed on a semiconductor layer via a gate insulating film, a channel region disposed below the gate electrode, a diffusion region disposed on both sides of the channel region and having a conductive type opposite to that of the channel region, and memory functional units formed on both sides of the gate electrode and having a function of retaining charges; wherein outputs of the paired memory cells are inputted to the amplifier, wherein the memory functional unit includes a film having the function of retaining charges and whose surface is substantially parallel with the surface of a gate insulating film, and wherein the film having the function of retaining charges is disposed substantially parallel with the side face of the gate electrode.

13. A semiconductor memory device including:
an amplifier; and first and second paired memory cells each having a gate electrode formed on a semiconductor layer via a gate insulating film, a channel region disposed below the gate electrode, a diffusion region disposed on both sides of the channel region and having a conductive type opposite to that of the channel region, and memory functional units formed on both sides of the gate electrode and having a function of retaining charges; wherein outputs of the paired memory cells are inputted to the amplifier
wherein the memory functional unit includes a film having the function of retaining charges and whose surface is substantially parallel with the surface of a gate insulating film, and wherein the memory functional unit has an insulating film for separating the film having the function of retaining charges from the channel region or semiconductor layer, and the insulating film is thinner than the gate insulating film and has a thickness of 0.8 nm or more.

* * * * *